United States Patent
Lee et al.

(10) Patent No.: US 11,239,249 B2
(45) Date of Patent: Feb. 1, 2022

(54) VERTICAL-TYPE MEMORY DEVICE

(71) Applicant: SAMSUNG ELECTRONICS CO., LTD., Suwon-si (KR)

(72) Inventors: Kyung Hwan Lee, Hwaseong-si (KR); Yong Seok Kim, Suwon-si (KR); Jun Hee Lim, Seoul (KR); Kohji Kanamori, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

(21) Appl. No.: 16/533,193

(22) Filed: Aug. 6, 2019

(65) Prior Publication Data
US 2020/0203371 A1  Jun. 25, 2020

(30) Foreign Application Priority Data

Dec. 21, 2018 (KR) ........................ 10-2018-0167479

(51) Int. Cl.
*H01L 27/11556* (2017.01)
*H01L 27/11582* (2017.01)
*H01L 27/11526* (2017.01)
*H01L 25/18* (2006.01)
*H01L 27/11573* (2017.01)
(Continued)

(52) U.S. Cl.
CPC .. *H01L 27/11582* (2013.01); *H01L 21/02636* (2013.01); *H01L 21/31144* (2013.01); *H01L 25/18* (2013.01); *H01L 27/11526* (2013.01); *H01L 27/11556* (2013.01); *H01L 27/11573* (2013.01)

(58) Field of Classification Search
CPC .......................... H01L 27/11551–11556; H01L 27/11578–11582
See application file for complete search history.

(56) References Cited

U.S. PATENT DOCUMENTS 9,236,395 B1  1/2016 Sasaki
9,570,463 B1  2/2017 Zhang et al.
(Continued)

OTHER PUBLICATIONS

Dingemans, et al., "Controlling the fixed charge and passivation properties of Si(100)/Al2O3 interfaces using ultrathin SiO2 interlayers synthesized by atomic layer deposition", Journal of Applied Physics, 110, pp. 093715-1-093715-6.
(Continued)

*Primary Examiner* — Eric A. Ward
(74) *Attorney, Agent, or Firm* — F. Chau & Associates, LLC

(57) ABSTRACT

A vertical-type memory device includes: a first gate structure including first gate electrodes spaced apart from each other and stacked on a substrate; first channel structures penetrating through the first gate structure and being in contact with the substrate; a second gate structure including second gate electrodes spaced apart from each other and stacked on the first gate structure; and second channel structures penetrating through the second gate structure and being in contact with the first channel structures. The first channel structures each may include a first channel layer penetrating the first gate structure, and a first channel pad disposed on the first channel layer and including a first pad region including n-type impurities and a second pad region including p-type impurities.

19 Claims, 24 Drawing Sheets

(51) Int. Cl.
  *H01L 21/02* (2006.01)
  *H01L 21/311* (2006.01)

(56) References Cited

U.S. PATENT DOCUMENTS

| | | |
|---|---|---|
| 9,691,783 B2 | 6/2017 | Yoon |
| 9,805,805 B1* | 10/2017 | Zhang ............... H01L 27/11575 |
| 9,853,046 B2 | 12/2017 | Lu et al. |
| 9,905,510 B2 | 2/2018 | Komori |
| 2012/0003800 A1* | 1/2012 | Lee ................... H01L 27/11578 |
| | | 438/261 |
| 2012/0061744 A1* | 3/2012 | Hwang ............. H01L 27/11573 |
| | | 257/324 |
| 2016/0247815 A1 | 8/2016 | Oori |
| 2017/0110473 A1 | 4/2017 | Lee |
| 2017/0154892 A1* | 6/2017 | Oh ...................... H01L 23/5283 |
| 2017/0213843 A1* | 7/2017 | Choi ....................... H01L 28/00 |
| 2017/0345843 A1* | 11/2017 | Lee ................... H01L 27/11575 |
| 2018/0040626 A1 | 2/2018 | Zhu et al. |
| 2018/0308858 A1* | 10/2018 | Hopkins ........... H01L 27/11556 |
| 2019/0115364 A1* | 4/2019 | Jeon ....................... G11C 16/30 |

OTHER PUBLICATIONS

Majumdar, et al. "Undoped-body extremely thin SOI MOSFETs with back gates", IEEE Transactions On Electron Devices, vol. 56, No. 10, Oct. 2009, pp. 2270-2276.

\* cited by examiner

I-I'

VERTICAL-TYPE MEMORY DEVICE

CROSS-REFERENCE TO RELATED APPLICATION(S)

This application claims priority under 35 U.S.C. § 119 to Korean Patent Application No. 10-2018-0167479, filed on Dec. 21, 2018, in the Korean Intellectual Property Office, the disclosure of which is herein incorporated by reference in its entirety.

TECHNICAL FIELD

Example embodiments of the present inventive concept relate to a vertical-type memory device.

DISCUSSION OF RELATED ART

Electronic products have consistently been reduced in size and at the same time designed to process high capacity data. Accordingly, there is an ever-increasing demand for semiconductor devices used in the electronic products to have higher integration density. To increase integration density of a semiconductor memory device, a vertical-type memory device, in which memory cells having a vertical-type transistor structure rather than a general planar transistor structure are stacked, has been developed.

SUMMARY

Example embodiments of the present inventive concept provide a vertical-type memory device having enhanced integration density and excellent electrical properties.

According to an example embodiment of the present inventive concept, a vertical-type memory device includes: a first gate structure including first gate electrodes spaced apart from each other and stacked on a substrate; first channel structures penetrating through the first gate structure and being in contact with the substrate; a second gate structure including second gate electrodes spaced apart from each other and stacked on the first gate structure; and second channel structures penetrating through the second gate structure and being in contact with the first channel structures. The first channel structures each may include a first channel layer penetrating the first gate structure, and a first channel pad disposed on the first channel layer and including a first pad region including n-type impurities and a second pad region including p-type impurities.

According to an example embodiment of the present inventive concept, a vertical-type memory device includes: a first gate structure including first gate electrodes spaced apart from each other and stacked on a substrate, and a semiconductor layer disposed on the first gate electrodes; a second gate structure including second gate electrodes spaced apart from each other and stacked on the first gate structure; and channel structures penetrating through the first gate structure and the second gate structure and being in contact with the substrate. The semiconductor layer may include first semiconductor regions and second semiconductor regions extending in a first direction parallel to an upper surface of the substrate and alternately disposed in a second direction intersecting the first direction.

According to an example embodiment of the present inventive concept, a vertical-type memory device includes; a first gate structure including first gate electrodes spaced apart from each other and stacked on a substrate, and a semiconductor layer disposed on the first gate electrodes; a first channel structure penetrating through the first gate structure and being in contact with the substrate; a second gate structure including second gate electrodes spaced apart from each other and stacked on the first gate structure; and a second Channel structure penetrating through the second gate structure and being in contact with the first channel structure. The first gate structure may include a first channel layer penetrating the first gate structure, and an insulating layer positioned at a level the same as a level of the semiconductor layer and locally disposed on an internal side surface of the first channel layer.

BRIEF DESCRIPTION OF THE DRAWINGS

The above and other aspects and features of the present inventive concept will be more clearly understood from the following detailed description, taken in conjunction with the accompanying drawings, in which.

Figure 1:
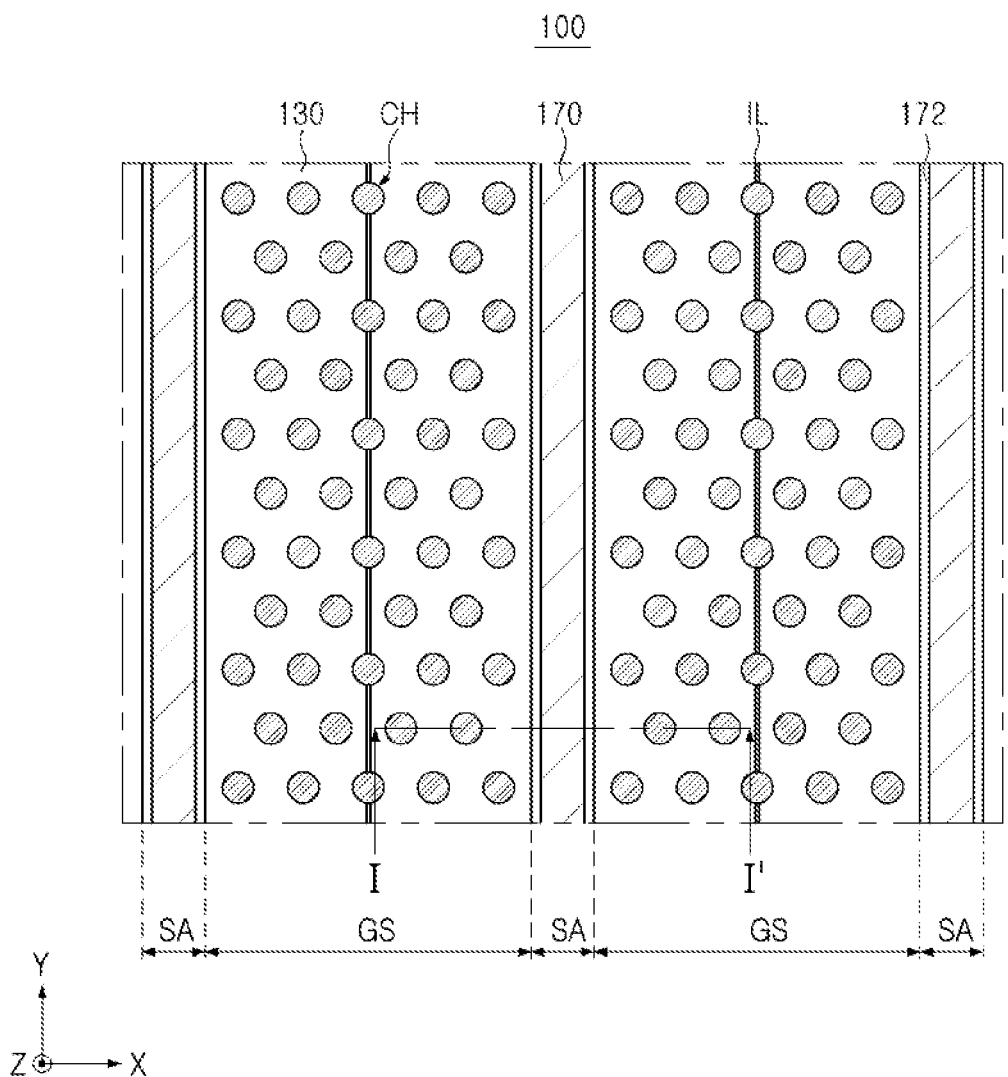
FIG. 1 is a schematic plan diagram illustrating a vertical-type memory device according to an example embodiment of the present inventive concept.

Since the drawings in FIGS. 1-24 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, example embodiments of the present inventive concept will be described as follows with reference to the accompanied drawings.

Figure 2:
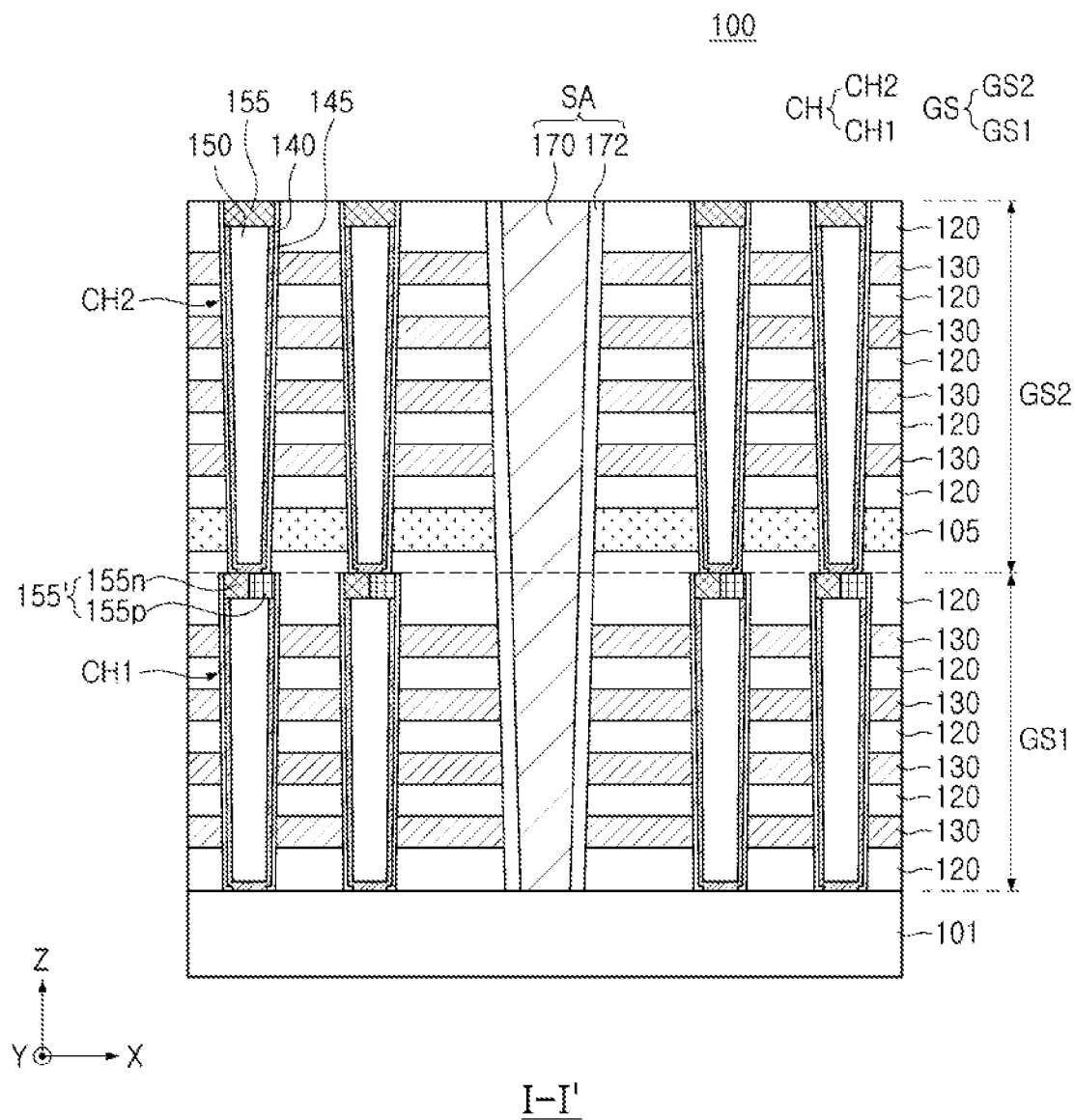
FIG. 2 is a cross-sectional diagram illustrating a vertical-type memory device according to an example embodiment of the present inventive concept.

FIG. 1 is a schematic plan diagram illustrating a vertical-type memory device according to an example embodiment of the present inventive concept. FIG. 2 is a cross-sectional diagram illustrating a vertical-type memory device according to an example embodiment of the present inventive concept.

Referring to FIGS. 1 and 2, a vertical-type memory device 100 may include a substrate 101, gate structures GS disposed on the substrate 101 and including gate electrodes 130, channel structures CH extending in a direction (e.g., Z direction) perpendicular to an upper surface of the substrate 101, penetrating the gate structures GS, and each including a channel layer 140 disposed therein, and separation regions SA alternately disposed with the gate structures GS in a direction (e.g., X direction) parallel to an upper surface of the substrate 101 on the substrate 101. For example, the gate structures GS may extend parallel to each other in Y direction, and separation regions SA may be disposed to separate the gate structures GS from each other in the X direction perpendicular to the Y direction. The X and Y directions may be parallel to a top surface of the substrate 101.

The gate structures GS may include a first gate structure GS1 and a second gate structure GS2 sequentially stacked on the substrate 101. The first and second gate structures GS1 and GS2 each may include mold insulating layers 120 and gate electrodes 130 alternately stacked along the Z direction. The second gate structure GS2 may further include an intermediate insertion layer 105 disposed under the gate electrodes 130 and spaced apart from the gate electrodes 130 by the mold insulating layer 120. The channel structures CH each may include a first channel structure CH1 and a second channel structure CH2 alternately stacked along the Z direction on the substrate 101. The first and second channel structures CH1 and CH2 each may include the channel layer 140, a gate dielectric layer 145 disposed between the channel layer 140 and the gate electrodes 130, channel pads 155 and 155' disposed on the channel layer 140, and a gap-fill insulating layer 150 filling a space surrounded by the channel layer 140. The separation regions SA each may include a source conductive layer 170 and a source insulating layer 172. A single memory cell string including a plurality of memory cells may be formed along the Channel structures CH in the vertical-type memory device 100. In an example embodiment of the present inventive concept, the vertical-type memory device 100 may be a vertical NAND Flash memory device, and the gate electrodes 130 of each of the first and second gate structures GS1 and GS2 may serve as gate electrodes for transistors of the memory cells.

The substrate 101 may have an upper surface extending in the x direction and the Y direction (X-Y plan). The substrate 101 may include a semiconductor material such as, for example, a group IV semiconductor, a group III-V compound semiconductor, or a group II-VI compound semiconductor. The group IV semiconductor may include, for example, silicon (Si), germanium (Ge), or silicon-germanium (SiGe). The group III-V compound semiconductor may include, for example, gallium phosphide (GaP), gallium arsenide (GaAs), indium arsenide (InAs), indium phosphide (InP), gallium antimonide (GaSb), indium antimonide (InSb), or indium gallium arsenide (InGaAs). The group II-VI compound semiconductor may include, for example, cadmium selenide (CdSe), cadmium sulfide (CdS), cadmium telluride (CdTe), zinc oxide (ZnO), zinc selenide (ZnSe), zinc sulfide (ZnS), or zinc telluride (ZnTe). The substrate 101 may include, for example, single crystal silicon (Si).

The plurality of gate electrodes 130 may be spaced apart from each other and stacked in a direction (Z direction) perpendicular to an upper surface of the substrate 101. The plurality of gate electrodes 130 may be disposed to extend in the direction parallel to an upper surface of the substrate 101. The gate electrodes 130 may extend while forming string selection lines, word lines, and ground selection lines. The word lines may be disposed between the ground selection lines and the string selection lines. An uppermost gate electrode 130 forming the string selection lines may be divided by an insulating layer IL in the X direction.

The number of the gate electrodes 130 and the number of the mold insulating layers 120 may vary depending on characteristics of the vertical-type memory device 100, and the number of the gate electrodes 130 included in the first gate structure GS1 and the number of the gate electrodes 130 included in the second gate structure GS2 may be the same or may be different from each other. The gate electrodes 130 may have substantially the same thickness, and thicknesses of the mold insulating layers 120 may be different depending on characteristics of the vertical-type memory device 100. However, the present inventive concept is not limited thereto.

The gate structures GS including the gate electrodes 130 may be spaced apart from each other in the X direction by the separation regions SA extending in the Y direction. For example, the gate electrodes 130 disposed between the two separation regions SA may form a single memory block, but the present inventive concept is not limited thereto.

The gate electrodes 130 may include a metal material such as, for example, tungsten (W), titanium (Ti), tantalum. (Ta), copper (Cu), or aluminum (Al). In an example embodiment of the present inventive concept, the gate electrodes 130 may include polycrystalline silicon (Si) or a metal silicide material such as, for example, nickel silicide ($NiSi_2$), titanium silicide tungsten silicide ($WSi_2$), or cobalt silicide ($CoSi_2$). In an example embodiment of the present inventive concept, the gate electrodes 130 may further include a diffusion barrier layer, and the diffusion barrier layer may include, for example, tungsten nitride (WN), tantalum nitride (TaN), titanium nitride (TiN), titanium aluminum nitride (TiAlN), or a combination thereof. For example, the gate electrodes 130 may include at least two layers that are stacked.

The mold insulating layers 120 may be disposed between the gate electrodes 130, and may be disposed in an upper portion and a lower portion of the gate structure GS. The mold insulating layers 120 may also be spaced apart from each other in the Z direction perpendicular to an upper surface of the substrate 101 and may extend in the Y direction parallel to an upper surface of the substrate 101, The mold insulating layers 120 may include an insulating material such as, for example, silicon oxide ($SiO_2$) or silicon nitride ($Si_3N_4$). In an example embodiment of the present inventive concept, side surfaces of the mold insulating layers 120 may be coplanar with side surfaces of the gate electrodes 130, but the present inventive concept is not limited thereto. In an example embodiment of the present inventive concept, side surfaces of the mold insulating layers 120 each may be configured to protrude towards the source insulating layer 172 from side surfaces of the gate electrodes 130. Alternatively, in an example embodiment of the present inventive concept, side surfaces of the gate electrodes 130 each may be configured to protrude towards the source insulating layer 172 from side surfaces of the mold insulating layers 120.

The second gate structure GS2 disposed on the first gate structure GS1 may further include the intermediate insertion layer 105 extending parallel to an upper surface of the substrate 101. The intermediate insertion layer 105 may be disposed between an uppermost gate electrode 130 of the first gate structure GS1 and a lowermost gate electrode 130 of the second gate structure GS2, and may be spaced apart from these two adjacent gate electrodes 130 by the mold insulating layers 120. The intermediate insertion layer 105 may be spaced apart from the channel pads 155' of the first channel structures CH1. The intermediate insertion layer 105 may surround the second channel structures CH2 and may extend in the Y direction similarly to the gate electrodes 130 of the second gate structure GS2. The intermediate insertion layer 105 may be used as an etch stop layer when channel holes are formed for forming the second channel structures CH2. The configuration above will be described in greater detail with reference to FIG. 10.

The intermediate insertion layer 105 may include a conductive material or an insulating material. For example, even when the intermediate insertion layer 105 is formed of a conductive material, the intermediate insertion layer 105 may not perform an electrical function in the vertical-type memory device 100 as an electrical signal is not applied to the intermediate insertion layer 105. The intermediate insertion layer 105 may be formed of a material different from a material of the mold insulating layers 120. For example, the intermediate insertion layer 105 may be formed of a material having etch selectivity with respect to the mold insulating layers 120. In an example embodiment of the present inventive concept, the intermediate insertion layer 105 may include a material different from a material of the gate electrodes 130. For example, the intermediate insertion layer 105 may be formed of polycrystalline silicon (Si), but the present inventive concept is not limited thereto.

The channel structures CH may penetrate the gate structures GS, and may be spaced apart from each other and disposed on the substrate 101 while forming rows and columns. When viewed in a plan view, the channel structures CH may be disposed in zig-zag form along the X and Y directions. The first channel structures CH1 and the second channel structures CH2 included in the channel structures CH may be disposed to be connected to each other in the Z direction perpendicular to an upper surface of the substrate 101. For example, the first channel structures CH1 may penetrate through the first gate structure CH1 and may be in contact with the substrate 101, The second channel structures CH2 may penetrate through the second gate structure GS2 and may be in contact with the first channel structures CH1.

The first channel structures and the second channel structures CH2 each may have side surfaces perpendicular to an upper surface of the substrate 101, or may have sloped side surfaces. The more adjacent to the substrate 101 the first channel structures CH1 and the second channel structures CH2 are, the narrower the widths of the first channel structures CH1 and the second channel structures CH2 may be. When viewed in a plan view, the channel structures CH may each have a circular shape, and the widths of the first channel structures CH1 and the second channel structures CH2 may be diameters of the circular shape thereof, but the present inventive concept is not limited thereto.

The channel layer 140 penetrating the gate electrodes 130 may have a cylindrical shape surrounding the gap-fill insulating layer 150 disposed therein. The gate dielectric layer 145 may surround the channel layer 140, and may insulate the gate electrodes 130 from the channel layer 140.

The channel layer 140 of the second channel structure CH2 may be directly connected to the channel pad 155' of the first channel structure CH1, and the channel layer 140 of the first channel structure CH1 may be directly connected to the substrate 101. In an example embodiment of the present inventive concept, the channel layer 140 of the first channel structure CH1 may not be directly connected to the substrate 101, and may be connected to an epitaxial layer formed on the substrate 101. The channel layer 140 may include undoped polycrystalline silicon (Si). However, the present inventive concept is not limited thereto. For example, the channel layer 140 may include other semiconductor materials and/or may be doped with impurities. In addition, the channel layer 140 may be formed of multilayers.

The channel pads 155' and 155 may respectively be disposed on the channel layers 140 in the first channel structures CH1 and the second channel structures CH2. The channel pads 155 and 155' may cover upper surfaces of the gap-fill insulating layers 150 and may be electrically connected to the channel layers 140. The channel pads 155 and 155' may include, for example, doped polycrystalline silicon (Si).

The channel pads 155' of the first channel structures CH1 may be directly in contact with and electrically connected to the channel layer 140 of the second channel structures CH2. The channel pads 155' of the first channel structures CH1 may each include a first pad region 155n including n-type impurities and a second pad region 155p including p-type impurities. In an example embodiment of the present inventive concept, the first pad region 155n may include polycrystalline silicon (Si) doped with n-type impurities such as, for example, phosphorus (P), arsenic (As), or antimony (Sb), and the second pad region 155p may include polycrystalline silicon (Si) doped with p-type impurities such as, for example, aluminum (Al), boron (B), indium (In), or potassium (K). For example, the first pad regions 155n and the second pad regions 155p may be alternately disposed in the X direction parallel to an upper surface of the substrate 101. For example, the first pad regions 155n and the second pad regions 155p may be disposed on different straight lines in the Y direction parallel to an upper surface of the substrate 101 and intersecting the X direction. An area or a size of the first pad region 155n and an area or a size of the second pad region 155p may be different from each other on a planar surface parallel to an upper surface of the substrate 101. The channel pads 155 of the second channel structures CH2 may include n-type impurities.

The channel layer 140 of the first channel structure CH1 and the channel layer 140 of the second channel structure CH2 may be electrically connected to each other by the first pad region 155n and the second pad region 155p. As the channel pad 155' of the first channel structure CH1 includes the first pad regions 155n and the second pad regions 155p having conductivity-types different from each other, a path through which electrons are transferred and a path through Which holes are transferred may be divided between the channel layer 140 of the first channel structure CH1 and the channel layer 140 of the second channel structure CH2. For example, there may be two different paths for electron transfer and hole transfer, respectively, between the channel layer 140 of the first channel structure CH1 and the channel layer 140 of the second channel structure CH2.

Through the first pad region 155n, which may include n-type impurities, electrons may easily be transferred between the channel layer 140 of the first channel structure CH1 and the channel layer 140 of the second channel structure CH2. Through the second pad region 155p, which may include p-type impurities, holes may easily be transferred between the channel layer 140 of the first channel structure all and the channel layer 140 of the second channel structure CH2. As the channel pad 155' of the first channel structure CH1 includes the first pad regions 155n and the second pad regions 155p having conductivity-types different from each other, electron and hole paths may coexist between the channel layer 140 of the first channel structure CH1 and the channel layer 140 of the second channel structure CH1 As the holes are easily transferred, an operation of erasing data in memory cells of the vertical-type memory device 100 may easily be performed.

The gate dielectric layer 145 may be disposed between the gate electrodes 130 and the channel layer 140. The gate electrode 130 may cover an external side surface of the channel layer 140, and may extend in the Y direction. The gate dielectric layer 145 may include a tunneling layer, an electric charge storage layer, and a blocking layer sequentially stacked from the channel layer 140. The tunneling layer may include, for example, silicon oxide ($SiO_2$), silicon nitride ($Si_3N_4$), silicon oxynitride (SiON) or a combination thereof. The electric charge storage layer may be an electric charge trapping layer or a floating gate conductive layer. In an example embodiment of the present inventive concept, when the electric charge storage layer is an electric charge trapping layer, the electric charge storage layer may be formed of silicon nitride ($Si_3N_4$). In an example embodiment of the present inventive concept, when the electric charge storage layer is a floating gate conductive layer, the charge storage layer 144 may be formed of polycrystalline silicon (Si). The blocking layer may include, for example, silicon oxide ($SiO_2$), silicon nitride ($Si_3N_4$), silicon oxynitride (SiON), a high-k dielectric material, or a combination thereof. The high-k dielectric material may include metal oxides such as, for example, hafnium oxide ($HfO_2$), aluminum oxide ($Al_2O_3$), zirconium oxide ($ZrO_2$), lanthanum oxide ($La_2O_3$), titanium oxide ($TiO_2$), yttrium oxide ($Y_2O_3$), tantalum oxide ($Ta_2O_5$), and the like, having a dielectric constant higher than a dielectric constant of silicon oxide ($SiO_2$). In an example embodiment of the present inventive concept, at least a portion of the blocking layer may extend in a horizontal direction between the gate electrodes 130 and the mold insulating layers 120.

The separation regions SA may penetrate through the gate structures GS between the channel structures CH and may be connected to the substrate 101. The source conductive layer 170 may be spaced apart from and electrically insulated from the gate electrode 130 by the source insulating layer 172. The source insulating layer 172 including an insulating material may be formed on both side walls of the source conductive layer 170. Thus, the gate electrodes 130 may be separated from each other in the X direction with certain gaps with the source conductive layer 170 interposed therebetween. The source conductive layer 170 may be disposed in a form of line extending in the Y direction, and may be a common source line (CSL). The source conductive layers 170 may be disposed in the X direction at certain intervals. The source conductive layer 170 may have a shape in which a width of the source conductive layer 170 may decrease towards the substrate 101. Side surfaces of the source conductive layer 170 may be inclined with respect to an upper surface of the substrate 101. In an example embodiment of the present inventive concept, an impurity region may be disposed on the substrate 101 and may be in contact with the source conductive layer 170. For example, the source conductive layer 170 may extend in the Y direction on a portion of the impurity region. In some cases, the source conductive layer 170 may be formed on the entire impurity region in the Y direction.

Figure 3:
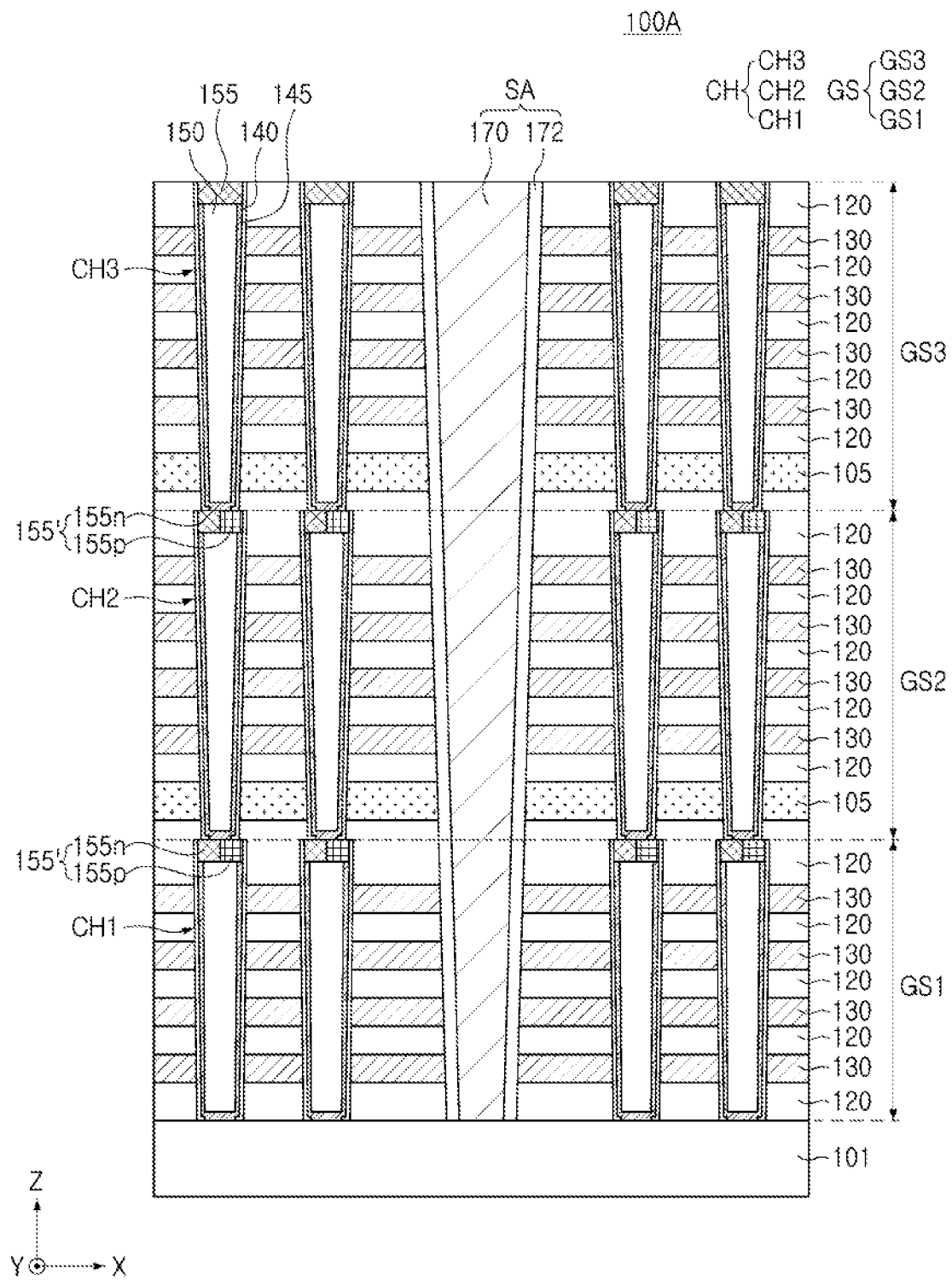
FIGS. 3 and 4 are cross-sectional diagrams each illustrating a vertical-type memory device according to an example embodiment of the present inventive concept.
Figure 4:
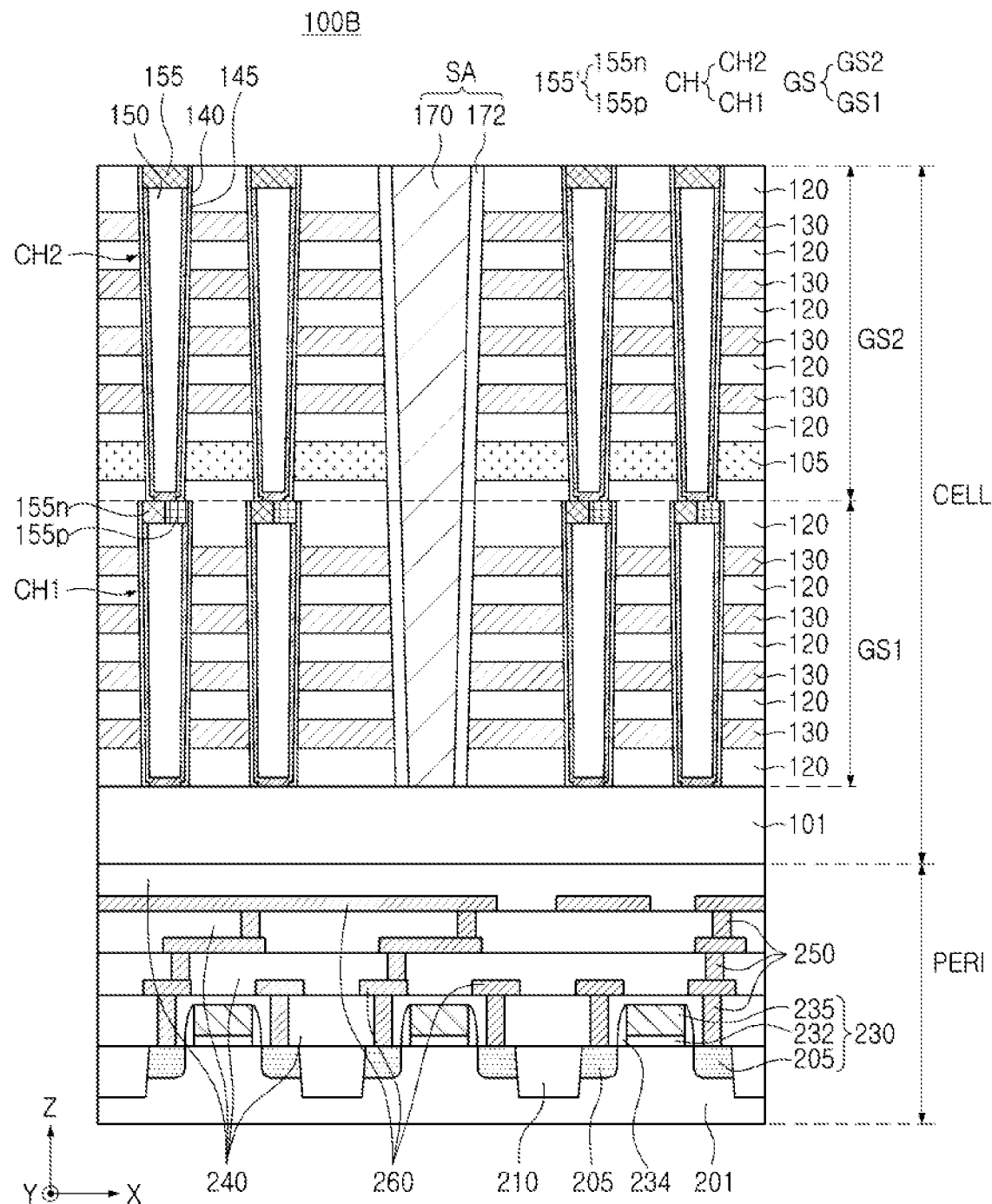

FIGS. 3 and 4 are cross-sectional diagrams illustrating a vertical-type memory device each according to an example embodiment of the present inventive concept.

Referring to FIG. 3, a vertical-type memory device 100A may include first to third gate structures GS1, GS2, and GS3 and first to third channel structures CH1, CH2, and CH3, The gate structures GS may include the three first to third gate structures GS1, GS2, and GS3 sequentially stacked on the substrate 101, and the channel structures CH may include the first to third channel structures CH1, CH2, and CH3 sequentially stacked on the substrate 101.

The third gate structure GS3 may include an intermediate insertion layer 105, mold insulating layers 120, and gate electrodes 130, similarly to the second gate structure GS2. The first gat structure GS1 may not include an intermediate insertion layer 105. Each of the third channel structure CH3 may include a gate dielectric layer 145, a channel layer 140, a gap-fill insulating layer 150, and a channel pad 155.

The first channel structures CH1 and the second channel structures CH2 may have structures the same as or similar to each other. In an example embodiment of the present inventive concept, the first Channel structures all and the second channel structures CH2 may have different heights in the Z direction. Each of the first channel structure CH1 and the second channel structure CH2 may include a gate dielectric layer 145, a channel layer 140, a gap-fill insulating layer 150, and a channel pad 155'.

The channel pads 155' of the first channel structures CH1 may be directly in contact with the channel layers 140 of the second channel structures CH2, and the channel pads 155' of the second channel structures CH2 may be directly in contact with the channel layers 140 of the third channel structures CH3. Thus, the channel layers 140 of the third channel structures CH3 may be electrically connected to the channel layers 140 of the first channel structures CH1.

The channel pads 155' of the first channel structures CH1 and the second channel structures CH2 may each include a first pad region 155n including n-type impurities and a second pad region 155p including p-type impurities. For example, the first pad regions 155n and the second pad regions 155p may be alternately disposed in the X direction parallel to an upper surface of the substrate 101. The first pad regions 155n and the second pad regions 155p may be disposed on different straight lines in the Y direction parallel to an upper surface of the substrate 101 and intersecting the X direction. An area or a size of the first pad region 155n and an area or a size of the second pad region 155p may be different from each other on a planar surface parallel to an upper surface of the substrate 101. The third channel structures CH3 may each include a channel layer 140 penetrating the third gate structure GS3. The channel pads 155 of the third channel structures CH3 may be disposed on the channel layers 140 of the third channel structures CH3, and may include n-type impurities.

The channel layer 140 of the first channel structure CH1 and the channel layer 140 of the second channel structure CH2 may be electrically connected to each other through the first pad region 155n and the second pad region 155p of the first channel structure CH1. For example, the channel layer 140 of the first channel structure CH1 and the channel layer 140 of the second channel structure CH2 may be directly in contact with the first pad region 155n and the second pad region 155p of the first channel structure CH1 The channel layer 140 of the second channel structure CH2 and the channel layer 140 of the third channel structure CH3 may be electrically connected to each other through the first pad region 155n and the second pad region 155p of the second channel structure CH2. For example, the channel layer 140 of the second channel structure CH2 and the channel layer 140 of the third channel structure CH3 may be directly in contact with the first pad region 155n and the second pad region 155p of the second channel structure CH2.

As the channel pads 155' of the first channel structure CH1 and the second channel structure CH2 include the first pad regions 155n and the second pad regions 155p having conductivity-types different from each other, a path through which electrons are transferred and a path through which holes are transferred may be divided between the channel layer 140 of the first channel structure CH1 and the channel layer 140 of the second channel structure CH2. For example, there may be two different paths for electron transfer and hole transfer, respectively, between the channel layer 140 of the first channel structure CH1 and the channel layer 140 of the second channel structure CH2. Similarly, there may be two different paths for electron transfer and hole transfer, respectively, between the channel layer 140 of the second channel structure CH2 and the channel layer 140 of the third channel structure CH3.

Through the first pad regions 155n, which may include n-type impurities, electrons may easily be transferred between the channel layer 140 of the first channel structure CH1 and the channel layer 140 of the second channel structure CH2, and between the channel layer 140 of the second channel structure CH2 and the channel layer 140 of the third channel structure CH3. Through the second pad regions 155p, which may include p-type impurities, holes may easily be transferred between the channel layer 140 of the first channel structure CH1 and the channel layer 140 of the second channel structure CH2, and between the channel layer 140 of the second channel structure CH2 and the channel layer 140 of the third channel structure CH3. As the channel pads 155 of the first channel structure CH1 and the second channel structure CH2 include the first pad regions 155n and the second pad regions 155p having conductivity-types different from each other, electron and hole paths may coexist between the channel layer 140 of the first channel structure CH1 and the channel layer 140 of the second channel structure CH2, and between the channel layer 140 of the second channel structure CH2 and the channel layers 140 of the third channel structure CH3. As the holes are easily transferred, an operation of erasing data in memory cells of the vertical-type memory device 100A may easily be performed.

The separation region SA may penetrate through the first to third gate structures GS1, GS2, and GS3 and may extend in the Z direction onto the substrate 101.

As described above, in an example embodiment of the present inventive concept, the number of the gate structures GS stacked vertically in the vertical-type memory device may vary. In the vertical-type memory device according to an example embodiment of the present inventive concept, four or more gate structures may be stacked, and four or more channel structures may be stacked.

Referring to FIG. 4, a vertical-type memory device 100B may include a memory cell region CELL and a peripheral circuit region PERI. The memory cell region CELL may be disposed on the peripheral circuit region PERI. However, the present inventive concept is not limited thereto. For example, in an example embodiment of the present inventive concept, the memory cell region CELL may be disposed below the peripheral circuit region PERI.

As described with reference to FIG. 2, the memory cell region CELL may include a substrate 101, gate structure GS including first and second gate structures GS1 and GS2 sequentially disposed on the substrate 101, channel structure CH including first and second channel structures CH1 and CH2 sequentially stacked on the substrate 101 and extending in a direction (e.g., Z direction) perpendicular to an upper surface of the substrate 101, respectively penetrating through the first and second gate structures GS1 and GS2, and separation areas SA alternately disposed with the gate structures GS on the substrate 101. The first and second gate structures GS1 and GS2 may include gate electrodes 130 and mold insulating layers 120 alternately stacked along the Z direction. The second gate structure GS2 may further include an intermediate insertion layer 105 disposed below gate electrodes 130. The first and second channel structures CH1 and CH2 each may include a channel layer 140, a gate dielectric layer 145 disposed between the channel layer 140 and the gate electrodes 130, channel pads 155 and 155' disposed on the channel layer 140, and a gap-fill insulating layer 150 filling an internal space of the channel layer 140. The channel pad 155' may include a first pad region 155n and a second pad region 155p. The separation regions SA each may include a source conductive layer 170 and a source insulating layer 172. A single memory cell string including a plurality of memory cells may be formed along the channel structures CH in the vertical-type memory device 100B.

Alternative to the memory cell region CELL described above with reference to FIGS. 2 and 4, the memory cell region CELL may also have one of the structures described in the example embodiments described with reference to FIG. 3, 14, 18, or 24.

The peripheral circuit region PERI may include a base substrate 201, circuit devices 230 disposed on the base substrate 201, circuit contact plugs 250, and wiring lines 260. For example, the base substrate 201 may be disposed below the substrate 101, and transistors may be disposed on the base substrate 201 and may be included in a circuit device 230 in the peripheral circuit region PERI, for example, in a peripheral circuit.

Device isolation layers 210 may be formed in the base substrate 201 such that an active region may be defined. Source/drain regions 205 including impurities may be disposed in a portion of the active region. The base substrate 201 may include a semiconductor material, such as, for example, a group IV semiconductor, a group III-V compound semiconductor, or a group compound semiconductor.

The circuit devices 230 each may include transistors including a circuit gate insulating layer 232, a circuit gate electrode 235, and the source/drain regions 205. The source/drain regions 205 may be disposed in the active regions on opposite sides of each of the circuit gate electrode 235. Spacers 234 may be disposed on both sides of the circuit gate electrode 235. A plurality of peripheral region insulating layers 240 may be disposed on the base substrate 201 to cover the circuit device 230. The circuit contact plugs 250 may penetrate through the peripheral region insulating layers 240 and may be connected to the source/drain regions 205. An electrical signal may be applied to the circuit device 230 by the circuit contact plugs 250. The circuit contact plugs 250 may also be connected to the circuit gate electrode 235. The wiring lines 260 may be connected to the circuit contact plugs 250, and may be provided as a plurality of layers. The wiring lines 260 may be electrically connected to the gate electrodes 130 of the first and second gate stuctures GS1 and GS2 in the memory cell region CELL The circuit devices 230 may be electrically connected to the gate electrodes 130 in the memory cell region CELL. For example, the transistors included in the circuit devices 230 in the peripheral circuit region PERI may be electrically connected to the transistors of the memory cells in the memory cell region CELL.

FIGS. 5 to 13 are cross-sectional diagrams illustrating a method of manufacturing a vertical-type memory device according to an example embodiment of the present inventive concept. FIGS. 5 to 13 illustrate a region corresponding to the cross-sectional diagram illustrated in FIG. 2.

Figure 5:
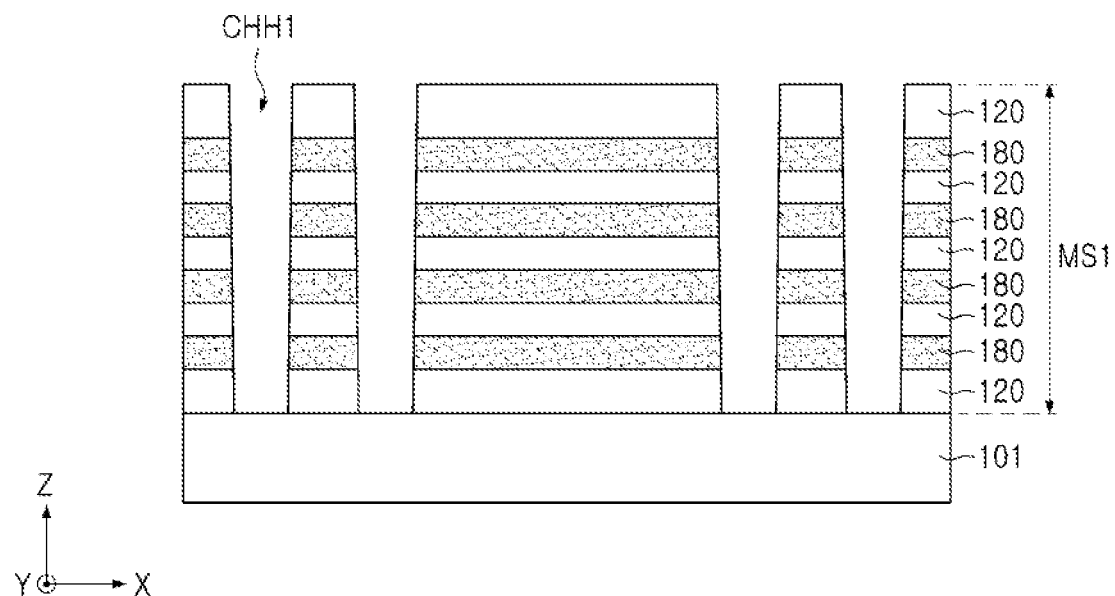
FIGS. 5 to 6, 7A, 7B, and 8 to 13 are cross-sectional diagrams illustrating a method of manufacturing a vertical-type memory device according to an example embodiment of the present inventive concept.

Referring to FIG. 5, a first stack structure MS1 may be formed by alternately stacking mold insulating layers 120 and sacrificial layers 180 on a substrate 101. The sacrificial layer 180 may be stacked first on the substrate 101.

The sacrificial layers 180 may be replaced with the gate electrodes 130 through a subsequent process. The sacrificial layers 180 may be formed of a material different from a material of the mold insulating layers 120. For example, the sacrificial layers 180 may include a material having etch selectivity with respect to a material of the mold insulating layers 120. Thus, the sacrificial layers 180 may be selectively etched while minimizing etching of the mold insulating layers 120 with respect to the predetermined etchant. For example, the mold insulating layers 120 may be formed of silicon oxide ($SiO_2$) or silicon nitride ($Si_3N_4$). The sacrificial layers 180 may be formed of a material selected from among, for example, silicon (Si), silicon oxide ($SiO_2$), silicon carbide (SiC), and silicon nitride ($Si_3N_4$), and may be formed of a material different from the material of the mold insulating layers 120. The number of the mold insulating layers 120 and the number of the sacrificial layers 180 may vary, and may be different from the examples illustrated in the diagram shown in FIG. 5.

First channel holes CHH1 penetrating a first stack structure MS1 may be formed. The first channel holes CHH1 may be formed by anisotropically etching the first stack structure MS1, and may be formed as holes. The process for forming the first channel holes CHH1 may be performed by forming a predetermined mask pattern for defining the first channel holes CHH1, and then the anisotropic etching process may be performed to etch the mold insulating layers 120 and the sacrificial layers 180 using the predetermined mask pattern as an etching mask. Side walls of the first channel holes CHH1 may not be perpendicular to an upper surface of the substrate 101. For example, the first channel holes CHH1 may have sloped side walls. The first channel hole CHH1 may be formed such that a portion of the substrate 101 may be recessed. In an example embodiment of the present inventive concept, an epitaxial layer may be formed in the first channel hole CHH1 by a selective epitaxial growth (SEG) process using the substrate 101 as a seed layer.

Figure 6:
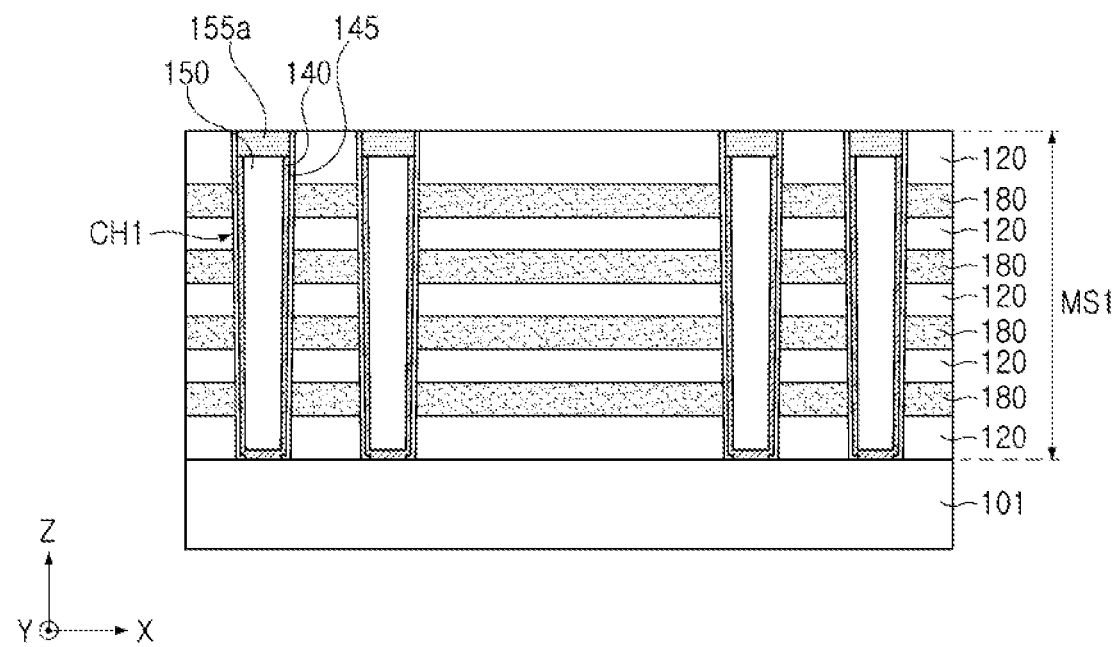

Referring to FIG. 6, a gate dielectric layer 145, a channel layer 140, a gap-fill insulating layer 150, and a preliminary pad 155a may be formed in each of the first channel holes CHH1.

The gate dielectric layer 145 may be conformally formed using, for example, an atomic layer deposition (ALD) process or a chemical vapor deposition (CVD) process. The channel layer 140 may be formed on the gate dielectric layer 145 in the first channel hole CHH1. The channel layer 140 may penetrate through a lower portion of the gate dielectric layer 145 and may be in contact with the substrate 101. The gap-fill insulating layer 150 may be formed on the channel layer 140. The gap-fill insulating layer 150 may be formed to fill the remaining space of the first channel hole CHH1, and may include an insulating material. The preliminary pad 155a may be formed of, for example, undoped polycrystalline silicon (Si).

Figure 7A:
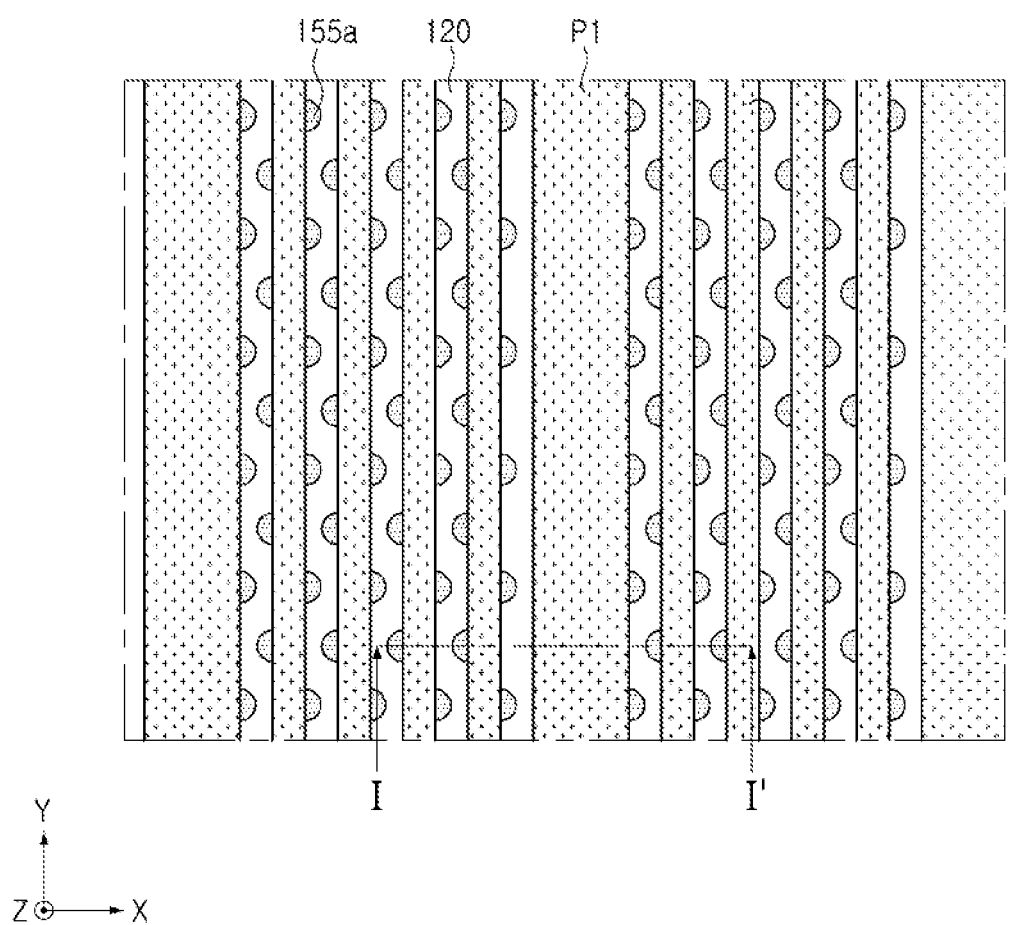
Figure 7B:
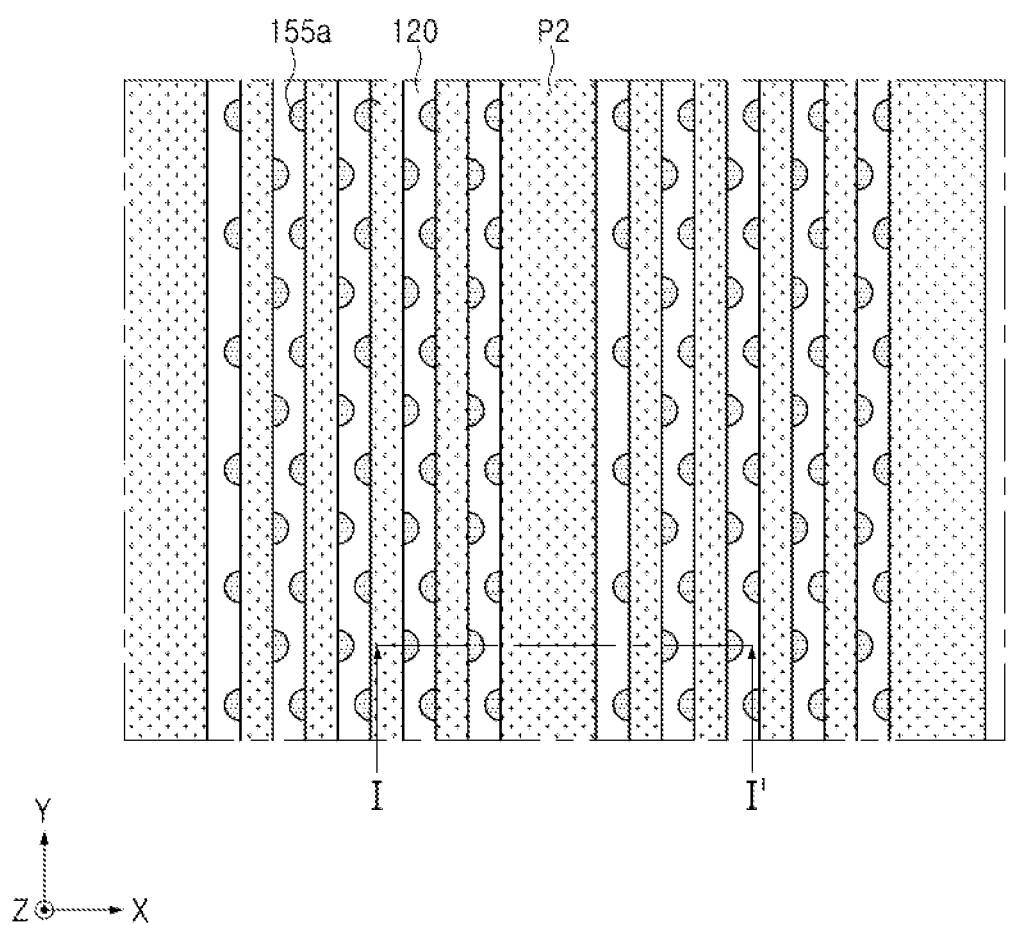
Figure 8:
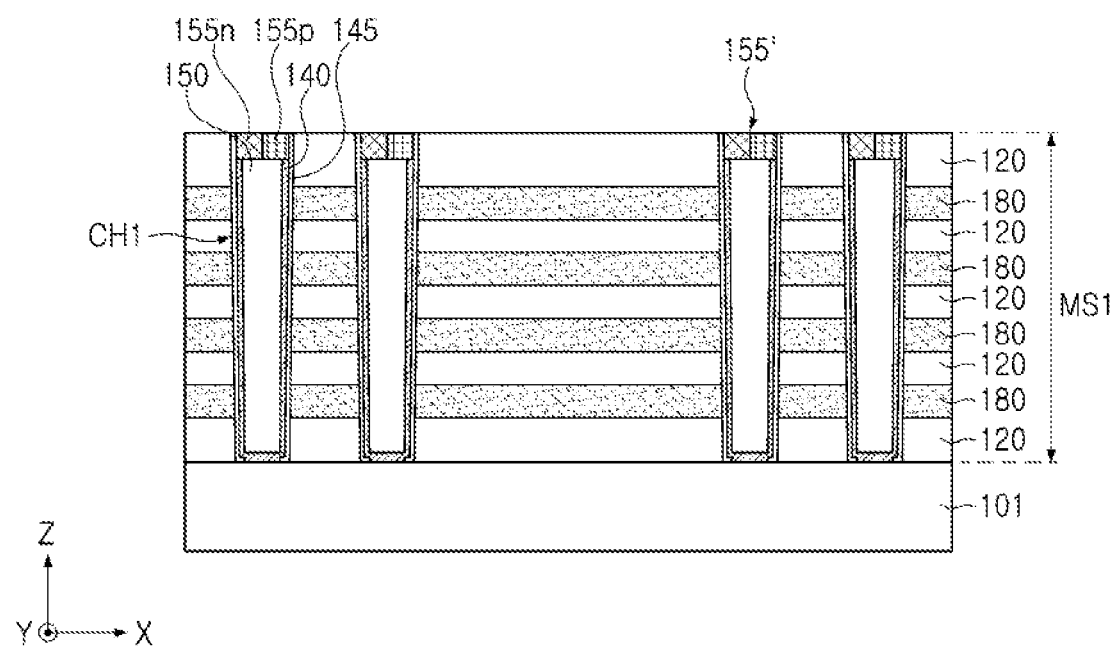

Referring to FIGS. 7A, 7B, and 8, a channel pad 155' including a first pad region 155n and a second pad region 155p may be formed. Accordingly, a first channel structure CH1 may be formed. Referring to FIG. 7A, a first protective layer P1 exposing partial regions of the preliminary pads 155a may be formed, and n-type impurities may be implanted into the exposed partial regions of the preliminary pads 155a through an ion implantation process. The first pad regions 155n including n-type impurities may be formed in the first stack structure MS1. The first protective layer P1 may include first openings exposing the partial regions of the preliminary pads 155a and extending in the Y direction. The first protective layer P1 may be removed after the process of ion implantation of n-type impurities is completed. Referring to FIG. 7B, a second protective layer P2 exposing the other regions of the preliminary pads 155a may be formed and p-type impurities may be implanted into the exposed other regions of the preliminary pads 155a through an ion implantation process. The second protective layer P2 may include second openings exposing the other regions of the preliminary pads 155a and extending in the Y direction. The second pad regions 155p including p-type impurities may be formed in the first stack structure MS1. The second protective layer P2 may be removed after the process of ion implantation of p-type impurities is completed. In FIGS. 7A and 7B, the first and second protective layers P1 and P2 may include the first and second openings extending in the Y direction, but the present inventive is not limited thereto. For example, the first and second protective layers P1 and P2 may include the first and second openings extending in the X direction, or in a direction inclined to the X direction and the Y direction. The channel pads 155' of the first channel structures CH1 formed above may each include a first pad region 155n including n-type impurities, and a second pad region 155p including p-type impurities.

Figure 9:
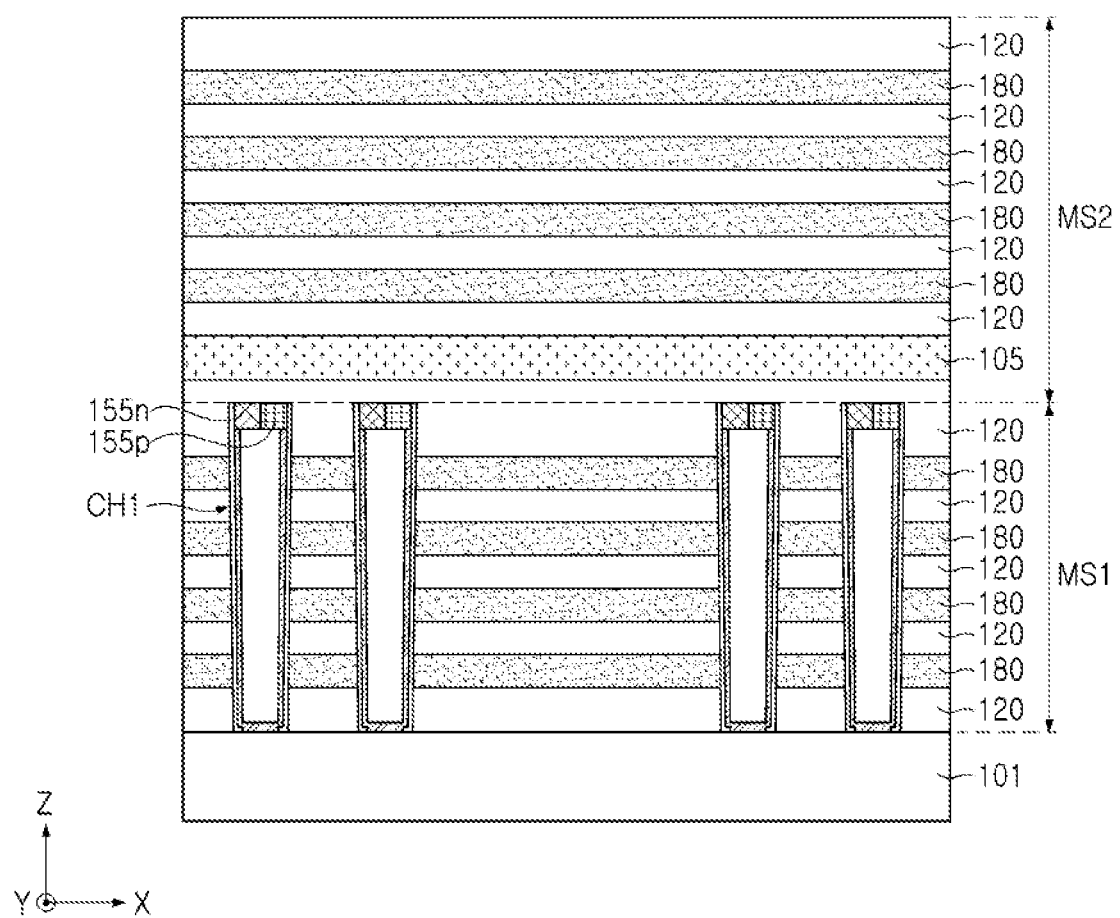

Referring to FIG. 9, a second stack structure MS2 may be formed on the first stack structure MS1.

A mold insulating layer 120 may be formed on the first stack structure MS1, and an intermediate insertion layer 105 may be formed on the mold insulating layer 120. The second stack structure MS2 may be formed by alternately stacking the mold insulating layers 120 and sacrificial layers 180 on the intermediate insertion layer 105. The intermediate insertion layer 105 may be disposed between an uppermost sacrificial layer 180 of the first stack structure MS1 and a lowermost sacrificial layer 180 of the second stack structure MS2, and may be spaced apart from the uppermost sacrificial layer 180 of the first stack structure MS1 and the lowermost sacrificial layer 180 of the second stack structure MS2, each with the mold insulating layer 120 interposed therebetween.

Figure 10:
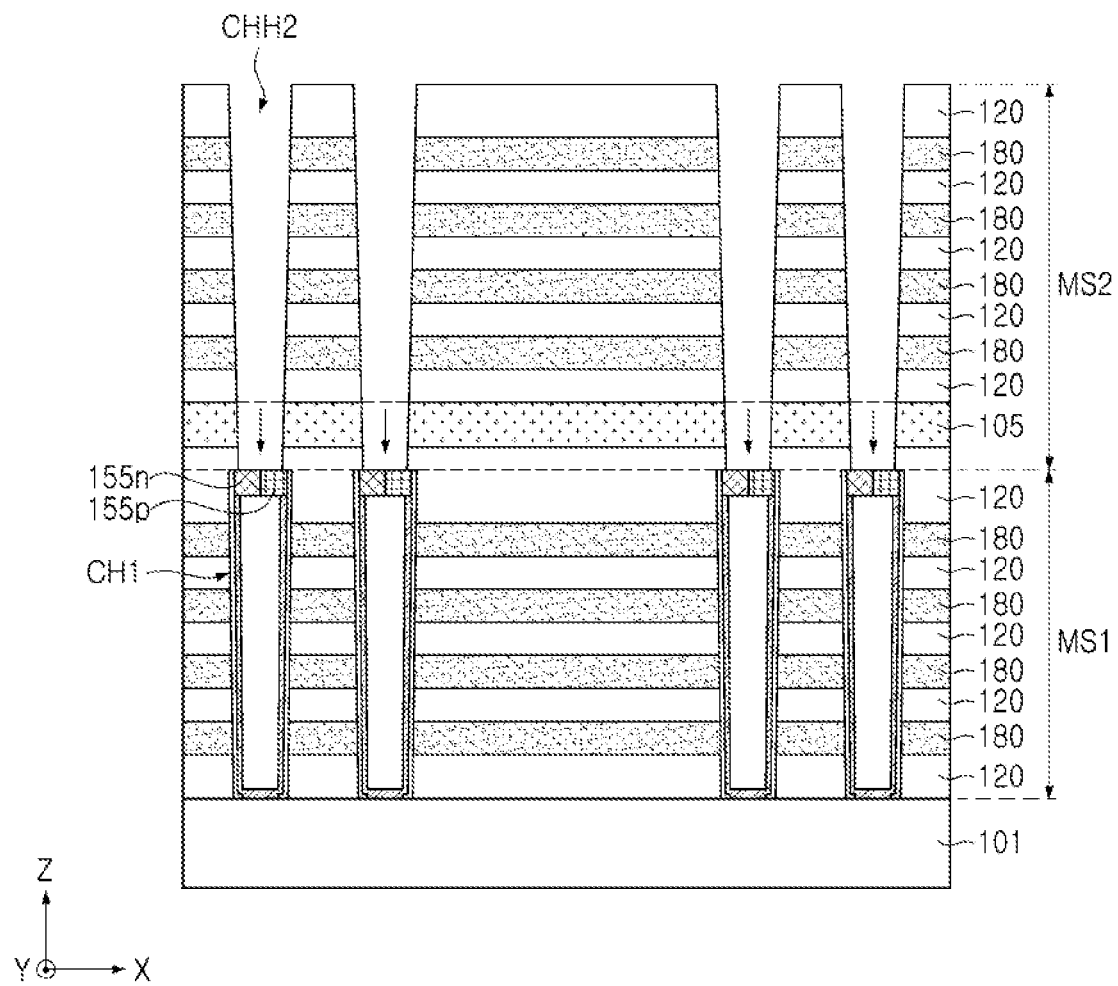

Referring to FIG. 10, second channel holes CHH2 penetrating the second stack structure MS2 may be formed.

The second channel holes CHH2 may be formed by anisotropically etching the second stack structure MS2, and each may be formed in a form of a hole. The process for forming the second channel holes CHH2 may be performed by forming a predetermined mask pattern for defining the second channel holes CHH2, and when forming the second channel holes CHH2, mold insulating layers 120 and sacrificial layers 180 may be etched until an intermediate insertion layer 105 is exposed using the predetermined mask pattern as an etching mask. As indicated by an arrow in FIG. 10, the second channel holes CHH2 may be formed by etching the intermediate insertion layer 105, and etching the mold insulating layer 120 below the intermediate insertion layer 105. Thus, the intermediate insertion layer 105 may function as an etch stop layer for adjusting etching depths of the second channel holes CHH2.

The second channel holes CHH2 may be formed such that at least portions of the channel pads 155' of first channel structures CH1 are exposed. For example, each of the second channel holes CHH2 may expose at least a portion of the first pad region 155n and a portion of the second pad region 155p of the channel pad 155'. Side walls of the second channel holes CHH2 may not be perpendicular to an upper surface of the substrate 101. For example, the second channel holes CHH2 may have sloped side walls.

Figure 11:
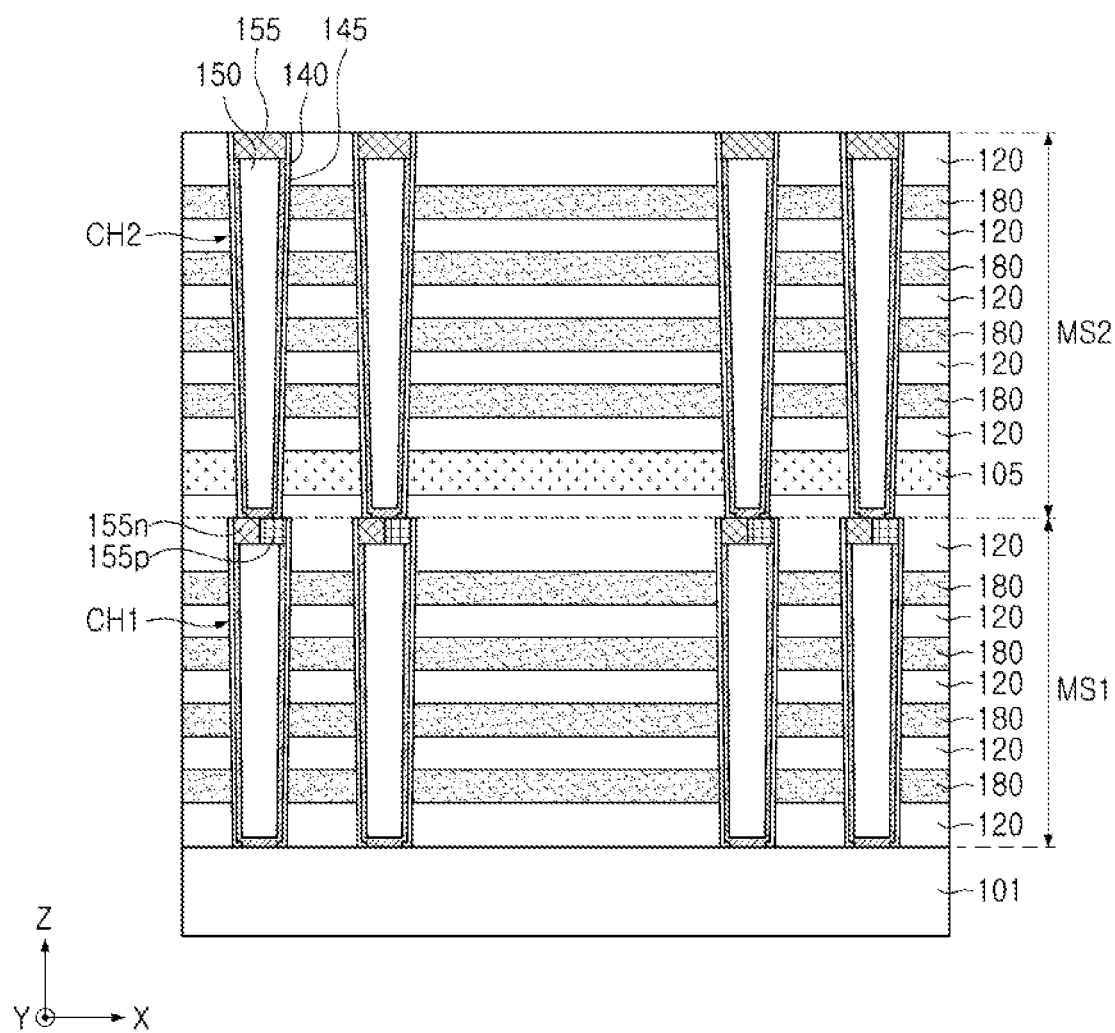

Referring to FIG. 11, second channel structures CH2 may each be formed by forming a gate dielectric layer 145, a channel layer 140, a gap-fill insulating layer 150, and a channel pad 155.

The second channel structures CH2 may be formed through a process similar to the process described with reference to FIG. 6. Channel pads 155 may include polycrystalline silicon (Si) including n-type impurities. The channel layers 140 of the second channel structures CH2 may be connected to the channel pads 155' of the first channel structures CH1. The channel layer 140 of the second channel structure CH2 may be connected to the first pad region 155n and the second pad region 155p of the channel pad 155' of the first channel structure CH1. For example, the channel layer 140 of the second channel structure CH2 may be directly in contact with the first pad region 155n and the second pad region 155p of the first channel structure CH1.

Figure 12:
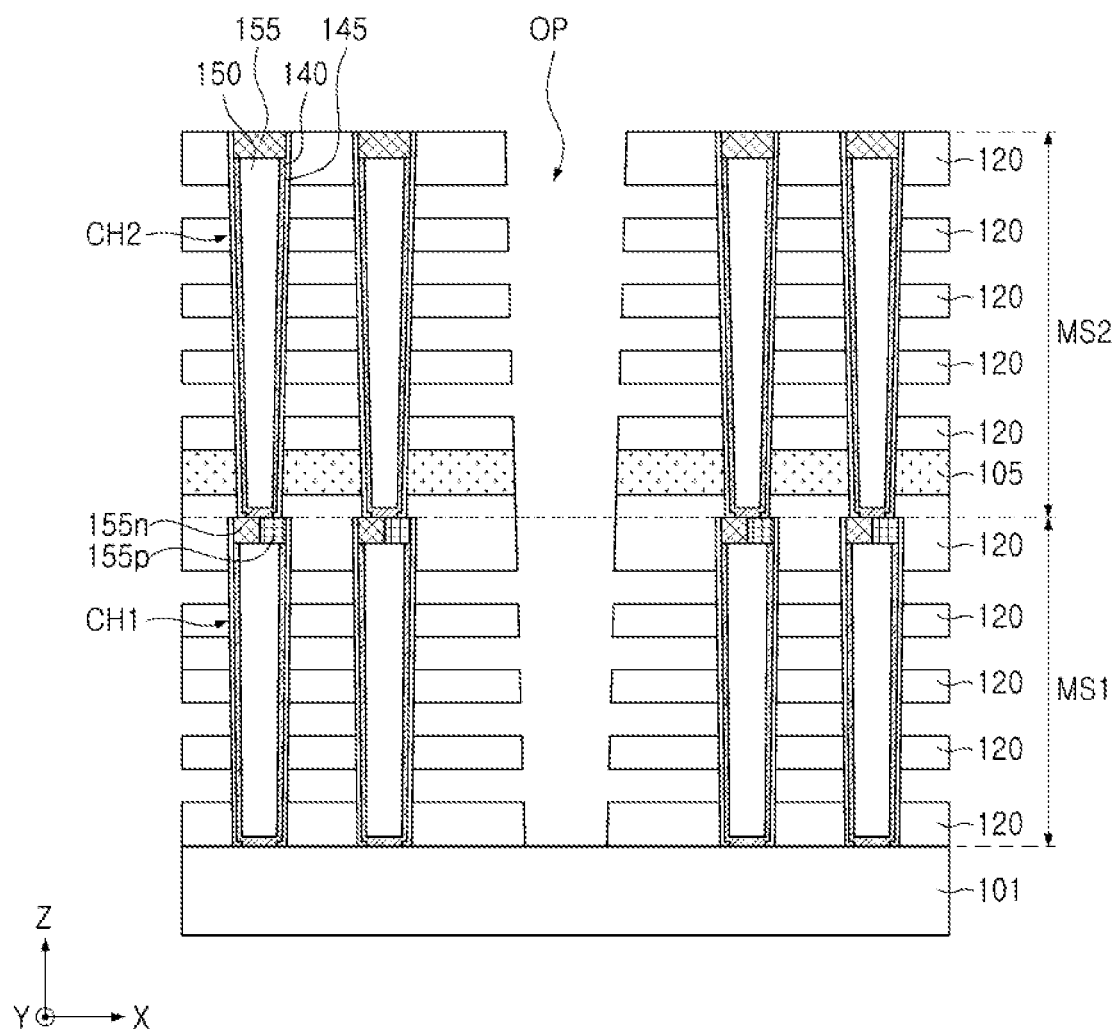

Referring to FIG. 12, an opening OP penetrating first stack structure MS1 and second stack structure MS2 may be formed.

The opening OP may be formed by forming a mask layer using a photolithography process, and anisotropically etching sacrificial layers 180, mold insulating layers 120, and an intermediate insertion layer 105 using the mask layer as an etching mask. Before forming the opening OP, damages to the second channel structures CH2 may be prevented by additionally forming an insulating layer on an uppermost mold insulating layer 120 and the channel pads 155 of the second stack structure MS2. Side walls of the opening OP may not be perpendicular to an upper surface of the substrate 101. For example, the opening OP may have sloped side walls. The opening OP may have a trench form and may extend in the Y direction.

The sacrificial layers 180 of the first and second stack structures MS1 and MS2 may be removed through the opening OP. For example, the sacrificial layers 180 may be selectively removed with respect to the mold insulating layers 120 and the intermediate insertion layer 105 using a wet etching process which is an isotropic etching process. For example, when the intermediate insertion layer 105 is formed of polycrystalline silicon (Si), the sacrificial layers 180 are formed of silicon nitride ($Si_3N_4$), and mold insulating layers 120 are formed of silicon oxide ($SiO_2$), the etching process may be performed using an etchant including phosphoric acid ($H_3PO_4$). Accordingly, a plurality of lateral openings may be formed between the mold insulating layers 120, and side walls of the first and second channel structures CH1 and CH2 may be partially exposed through the lateral openings.

Figure 13:
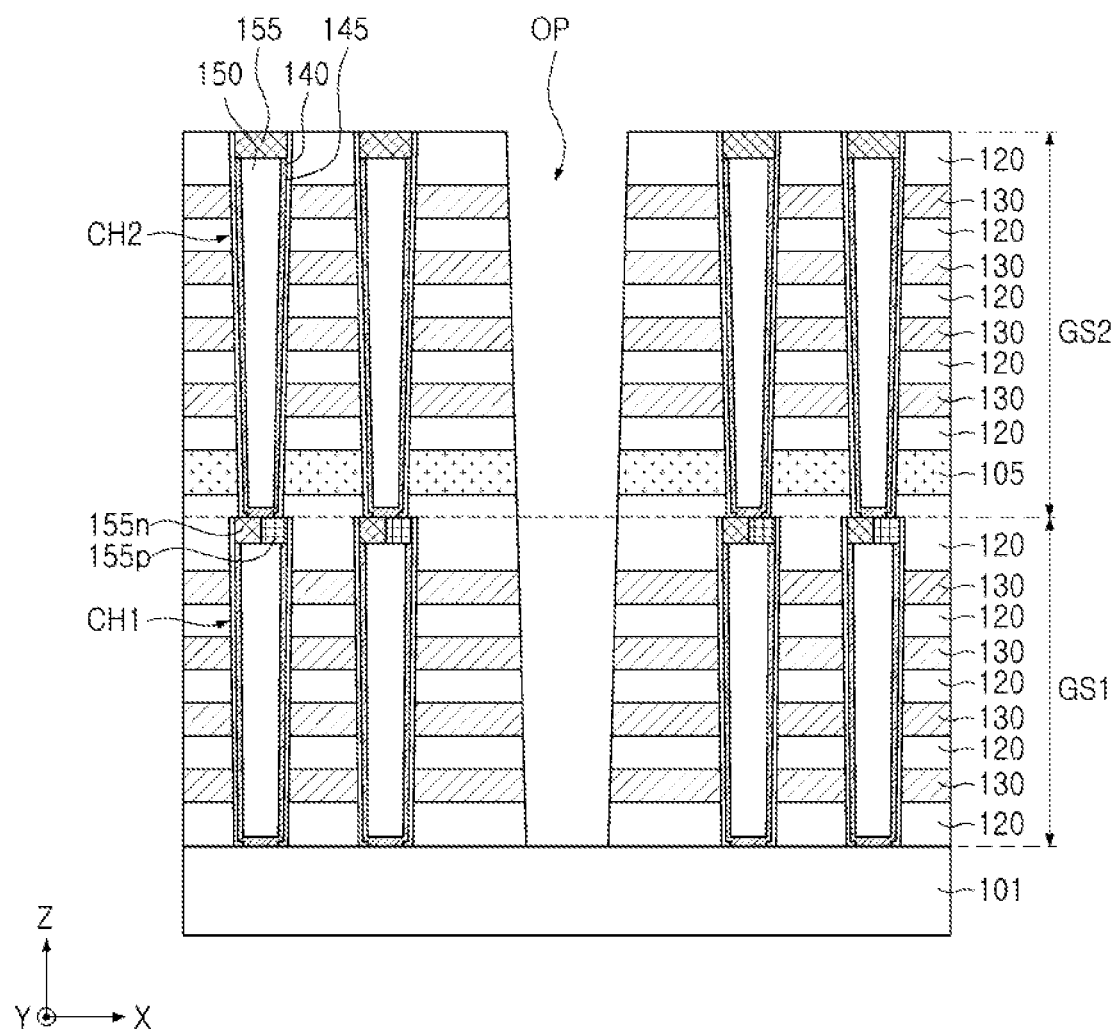

Referring to FIG. 13, gate electrodes 130 may be formed in the lateral openings in which the sacrificial layers 180 are removed.

A conductive material may fill the lateral openings, and the conductive material formed in the opening OP may be removed using an etching process such that the conductive material may be disposed only in the lateral openings. In an example embodiment of the present inventive concept, the mold insulating layers 120 may be configured to further protrude towards the opening OP than the gate electrodes 130. Alternatively, in an example embodiment of the present inventive concept, the mold insulating layers 120 may be further recessed with an isotropic etching process, so that the gate electrodes 130 may be configured to protrude towards the openings from side surfaces of the mold insulating layers 120. The gate electrode 130 may include, for example, a metal, a metal nitride, doped polycrystalline silicon (Si), a metal suicide, or a combination thereof.

As the gate electrodes 130 are formed in this step, first and second gate structures GS1 and GS2 may be formed.

Referring back to FIG. 2, a separation region SA may be formed by forming a source insulating layer 172 and a source conductive layer 170 in the opening OP.

The source insulating layer 172 may be formed in a tbrm of a spacer to expose an upper surface of a substrate 101 on side walls of the opening OP. The source insulating layer 172 may be formed of, for example, silicon nitride ($Si_3N_4$), silicon oxide ($SiO_2$), silicon oxynitride (SiON), or a low-k dielectric material having a low dielectric constant. The source conductive layer 170 may be formed by depositing a conductive material in the remaining space of the opening OP in which the source insulating layer 172 is formed. The gate electrodes 130 may be spaced apart from each other by the separation region SA in the X direction with certain gaps. The source conductive layer 170 may include, for example, a metal, a metal nitride, doped polycrystalline silicon (Si), metal silicide, or a combination thereof.

Figure 14:
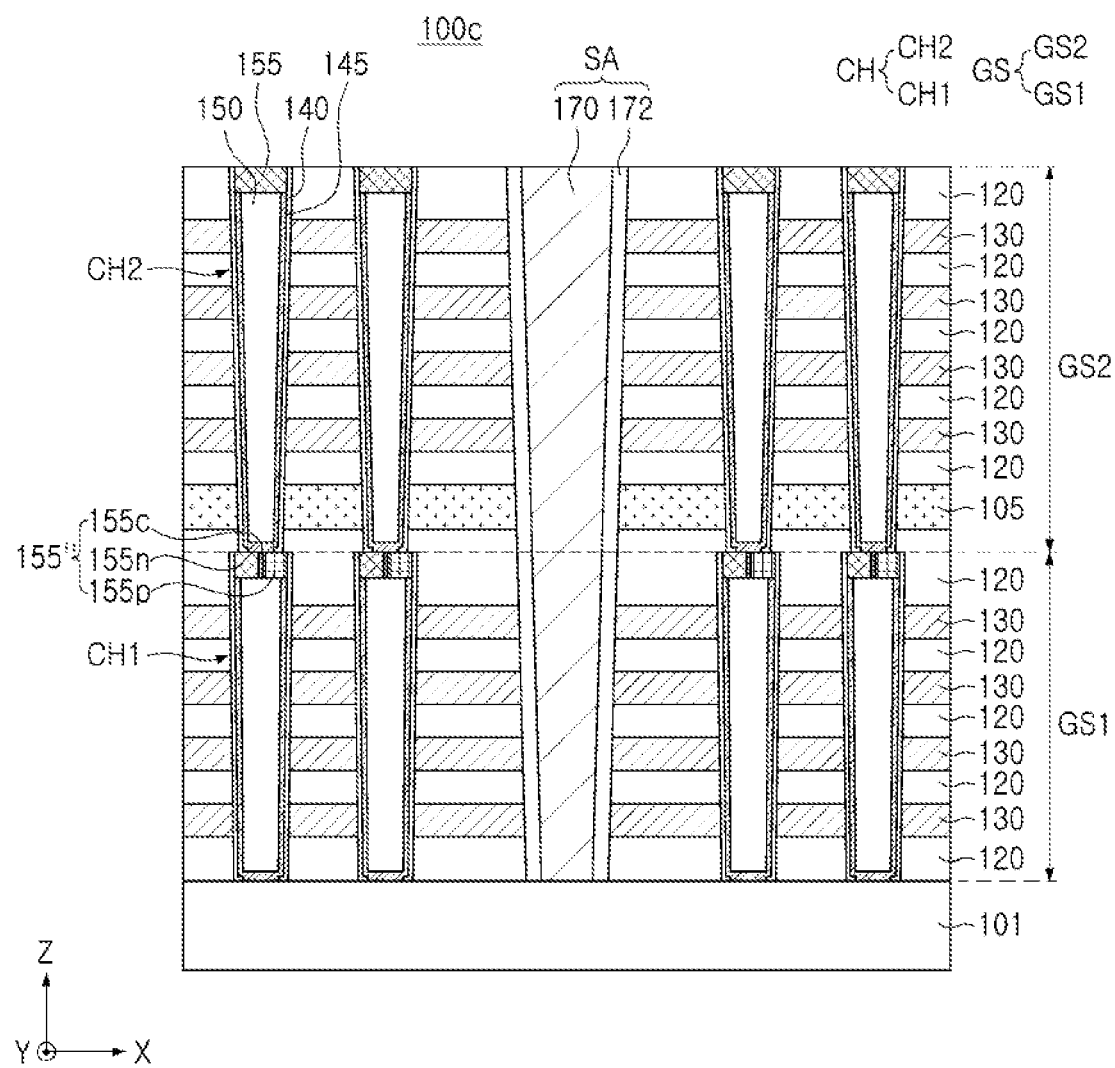
FIG. 14 is a cross-sectional diagram illustrating a vertical-type memory device according to an example embodiment of the present inventive concept.

FIG. 14 is a cross-sectional diagram illustrating a vertical-type memory device according to an example embodiment of the present inventive concept.

Referring to FIG. 14, a vertical-type memory device 100C may be configured such that a channel pad 155'' of a first channel structure CH1 may include a first pad region 155n, a second pad region 155p, and a diffusion barrier layer 155c disposed between the first pad region 155n and the second pad region 155p, differently from the vertical-type memory device 100 illustrated in FIG. 2. The diffusion barrier layer 155c may include, for example, silicon nitride ($Si_3N_4$). An area or a size of the first pad region 155n and an area or a size of the second pad region 155p may be different from each other on a planar surface parallel to an tipper surface of the substrate 101.

The diffusion barrier layer 155c may also be employed in the vertical-type memory devices 100A and 100B in FIGS. 3 and 4.

Figure 15:
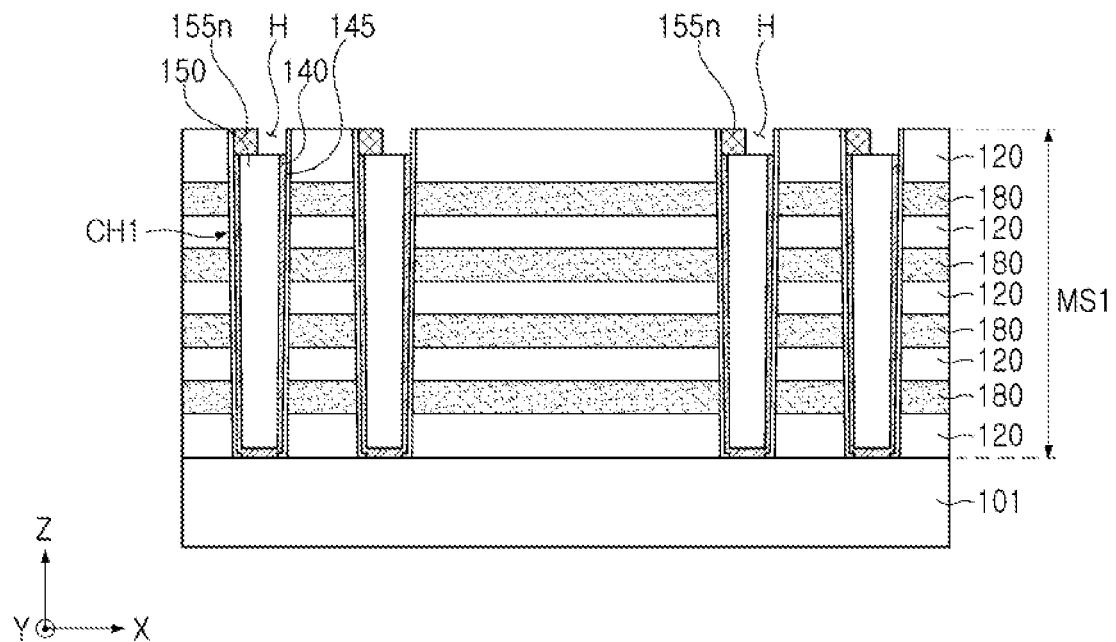
FIGS. 15 to 17 are cross-sectional diagrams illustrating a method of manufacturing a vertical-type memory device according to an example embodiment of the present inventive concept.
Figure 16:
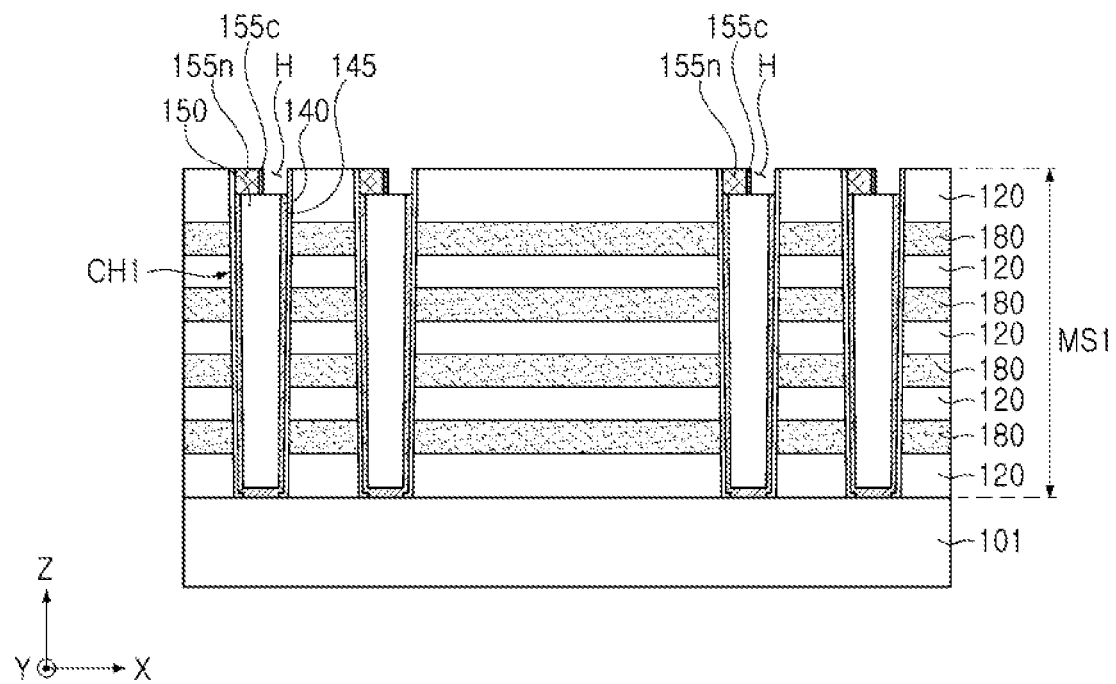
Figure 17:
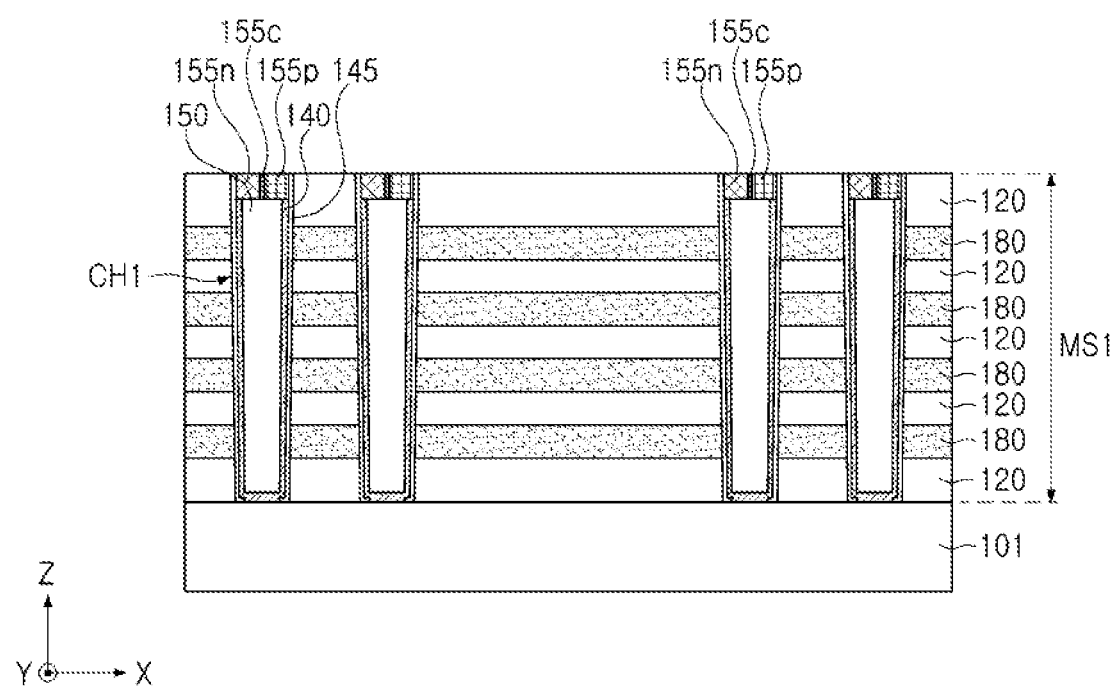

FIGS. 15 to 17 illustrate a method of manufacturing a vertical-type memory device 1000 according to an example embodiment of the present inventive concept.

Referring back to FIG. 5, a first stack structure MS1 may be formed by alternately stacking mold insulating layers 120 and sacrificial layers 180. First channel holes CHH penetrating the first stack structure MS1 may be formed.

Referring to FIG. 15, a gate dielectric layer 145, a channel layer 140, a gap-fill insulating layer 150, and a first pad region 155n may be formed in each of the first channel holes CHH1.

The gate dielectric layer 145, the channel layer 140, and the gap-fill insulating layer 150 may be sequentially formed in each of the first channel holes CHH1. A portion of the gap-fill insulating layer 150 and a portion of the channel layer 140 may be removed, and the first pad region 155n may be locally formed in the space of the removed portions. The first pad region 155n may include polycrystalline silicon (Si) including n-type impurities.

The forming of the first pad region 155n may include depositing a first semiconductor material layer for forming the first pad region 155n such that the first semiconductor material layer may fill the space in which a portion of the gap-fill insulating layer 150 and a portion of the channel layer 140 are removed, planarizing the first semiconductor material layer through a process such as, for example, a chemical mechanical polishing (CMP) process, or the like, such that the mold insulating layer 120 may be exposed, and forming holes H by partially removing the first semiconductor material. The first semiconductor material layer may include, for example, polycrystalline silicon (Si) including n-type impurities. In an example embodiment of the present inventive concept, the first semiconductor material layer may be formed through a direct deposition of an in-situ n-type impurities doped polycrystalline silicon (Si). Alternatively, the first semiconductor material layer may be formed of undoped polycrystalline silicon (Si) first followed by an ion implantation process to incorporate the n-type impurities into the polycrystalline silicon (Si).

Referring to FIG. 16, a diffusion barrier layer 155e may be formed on a side surface of the first pad region 155n.

The forming of the diffusion barrier layer 155e may include depositing a material layer for forming the diffusion barrier layer 155c on the structure illustrated in FIG. 15 and etching back the material layer to form the diffusion barrier layer 155c on the side surface of the first pad region 155n. In the etching back of the material layer process, except a portion of the material layer remaining on the side surface of the first pad region 155n as the diffusion barrier layer 155c, the rest of the material layer in the hole may be completely removed. The material layer may include, for example, silicon nitride ($Si_3N_4$).

Referring to FIG. 17, a channel pad 155' may be formed by forming a second pad region 155p being in contact with the diffusion barrier layer 155c.

The forming of the second pad region 155p may include depositing a second semiconductor material layer for forming the second pad region 155p such that the second semiconductor material layer may fill holes H, portions of the space in which a portion of the gap-fill insulating layer 150 and a portion of the channel layer 140 are removed, and planarizing the second semiconductor material layer using a process such as a CMP process, or the like, such that the mold insulating layer 120 may be exposed. The second semiconductor material layer may include, for example, polycrystalline silicon (Si) including p-type impurities. In an example embodiment of the present inventive concept, the second semiconductor material layer may be formed through a direct deposition of an in-situ p-type impurities doped polycrystalline silicon (Si). Alternatively, the second semiconductor material layer may be formed of undoped polycrystalline silicon (Si) first followed by an ion implantation process to incorporate the p-type impurities into the polycrystalline silicon (Si).

The processes described above with reference to FIGS. 9 to 13 may be performed.

Referring to FIG. 14, a separation region SA may be formed by forming a source insulating layer 172 and a source conductive layer 170 in the opening OP (see FIG. 13).

Figure 18:
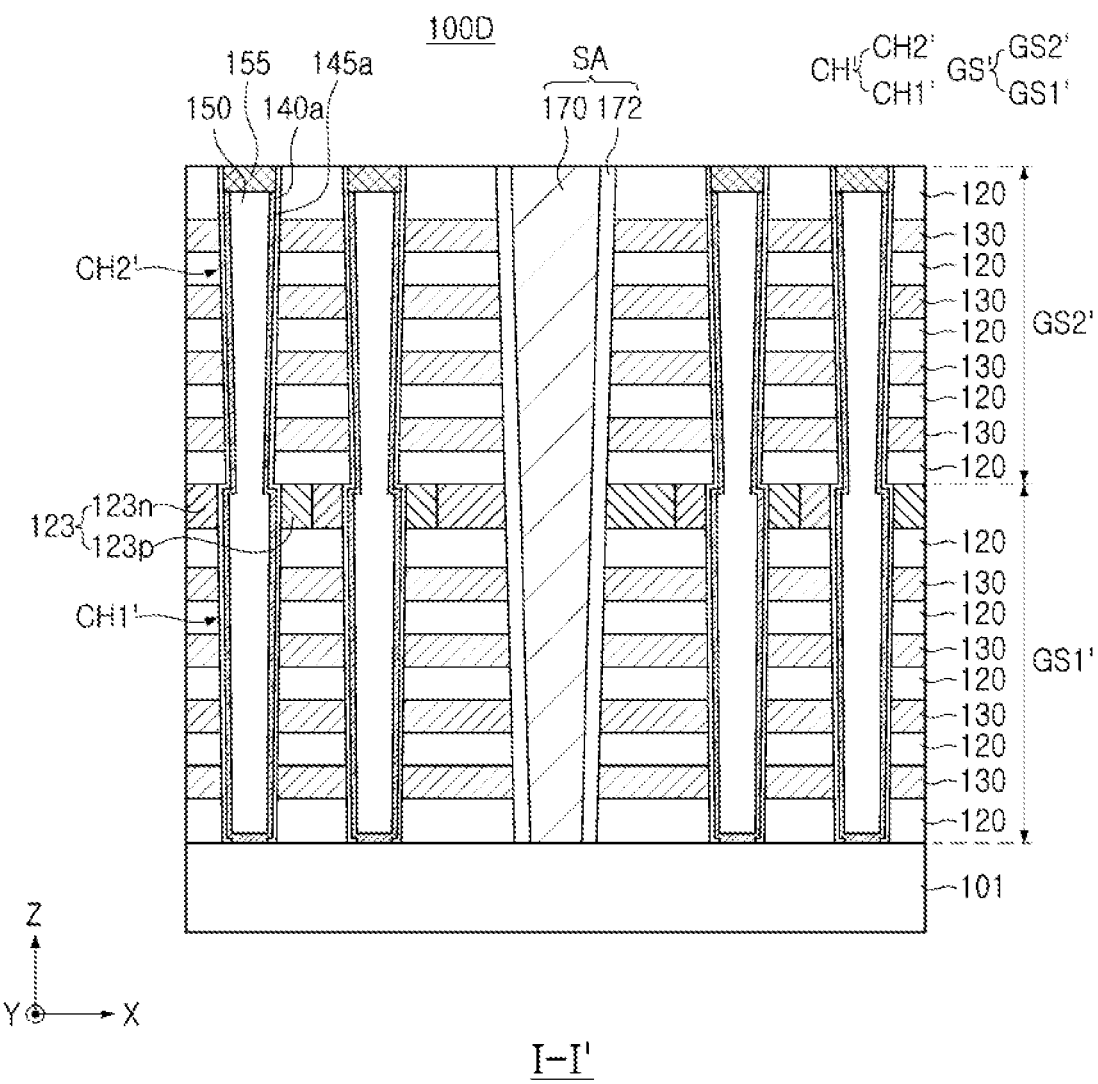
FIG. 18 is a cross-sectional diagram illustrating a vertical-type memory device according to an example embodiment of the present inventive concept.

FIG. 18 is a cross-sectional diagram illustrating a vertical-type memory device according to an example embodiment of the present inventive concept.

Referring to FIG. 18, a vertical-type memory device 100D may include a substrate 101, gate structures GS' disposed on the substrate 101 and including gate electrodes 130, channel structures CH' extending in a direction (e.g., Z direction) perpendicular to an upper surface of the substrate 101 and penetrating the gate structures GS', and separation regions SA alternately disposed with the gate structures GS' in a direction (e.g., X direction) parallel to an upper surface of the substrate 101 on the substrate 101.

The gate structure GS' may include a first gate structure GS1' and a second gate structure GS2' sequentially stacked on the substrate 101. The first and second gate structures GS1' and GS2' each may include alternately stacked mold insulating layers 120 and gate electrodes 130 along the Z direction. The first gate structure GS1' may further include a semiconductor layer 123 disposed on the gate electrodes 130. The separation regions SA each may include a source conductive layer 170 and a source insulating layer 172.

The channel structure CH' penetrating the gate structure GS' may include a gate dielectric layer 145a, a channel layer 140a, a gap-fill insulating layer 150, and a channel pad 155. The channel structures CH' may include first channel structures CH1' and second channel structures CH2' stacked upwardly and downwardly, and may each have a single channel pad 155 disposed in an upper portion of the second channel structure CH2'. In the first channel structures CH1' and the second channel structures CH2' stacked upwardly and downwardly, the gate dielectric layer 145a, the channel layer 140a, the gap-fill insulating layer 150 may be formed continuously. On a boundary between the second gate structure GS2' and the first gate structure GS1', the gate dielectric layer 145a and the channel layer 140a may have bent portions bent in a horizontal direction and then bent towards the substrate 101. On the boundary between the second gate structure GS2' and the first gate structure GS1', a width of the gap-fill insulating layer 150 may change discontinuously. On the boundary between the second gate structure GS2' and the first gate structure GS1', a width of the channel structure CH' may change discontinuously.

The semiconductor layer 123 may include first semiconductor regions 123n and second semiconductor regions 123p alternately disposed in the X direction and extending in the Y direction. The channel structures CH' may be in contact with the first semiconductor regions 123n and the second semiconductor regions 123p. The first semiconductor regions 123n may surround a portion of an upper region of the first channel structure CH1' and the second semiconductor regions 123p may surround the other portion of the upper region of the first channel structure CH1'. In a single first channel structure CH1', one of the first semiconductor regions 123n may be disposed on one side of the upper region of the first channel structure CH1', and one of the second semiconductor regions 123p may be disposed on the other side of the upper region of the first channel structure CH1'. The first semiconductor regions 123n may be formed of polycrystalline silicon (Si) including n-type impurities, and the second semiconductor regions 123p may be formed of polycrystalline silicon (Si) including p-type impurities. A partial region of the channel layer 140 of the first channel structure CH1' adjacent to the first semiconductor region 123n may be configured such that electrons may be easily transferred in the region. The other region of the channel layer 140 of the first channel structure CH1' adjacent to the second semiconductor region 123p may be configured such that holes may be easily transferred in the region. As the channel layer 140 of the first channel structure CH1' includes two regions respectively adjacent to the first semiconductor region 123n and the second semiconductor region 123p having conductivity-types different from each other, electron and hole paths may coexist between the channel layer 140 of the first channel structure CH1' and the channel layer 140 of the second channel structure CH2'. As the holes are easily transferred, an operation of erasing data in memory cells of the vertical-type memory device 100D may easily be performed.

In a single separation region SA, one of the first semiconductor regions 123n may be disposed on one side of the separation region SA, and one of the second semiconductor regions 123p may be disposed on the other side of the separation region SA.

FIGS. 19 to 23 are cross-sectional diagrams illustrating a method of manufacturing a vertical-type memory device according to an example embodiment of the present inventive concept.

Figure 19:
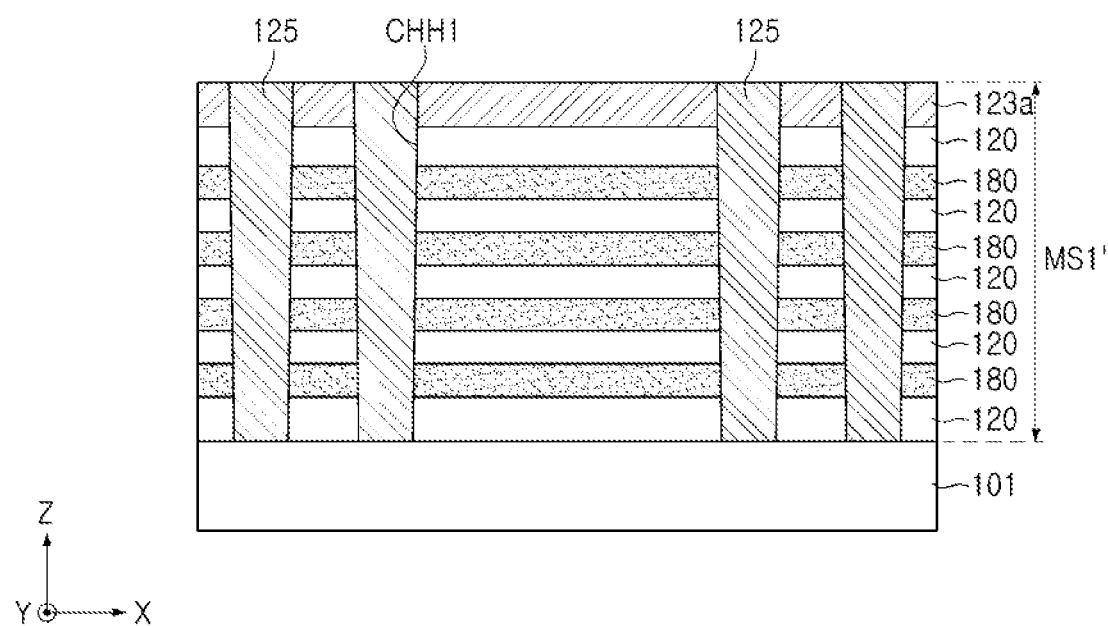
FIGS. 19, 20A, 20B and 21 to 23 are cross-sectional diagrams illustrating a method of manufacturing a vertical-type memory device according to an example embodiment of the present inventive concept.

Referring to FIG. 19, a first stack structure MS1' may be formed by alternately stacking mold insulating layers 120 and sacrificial layers 180, and forming a preliminary semiconductor layer 123a on an uppermost mold insulating layer 120. First channel holes CHH1 penetrating the first stack structure MS1' may be formed. Sacrificial channel layers 125 may be formed in the first channel holes CHH1. The sacrificial channel layers 125 may be formed of a material different from materials of the mold insulating layers 120, the sacrificial layers 180, and the preliminary semiconductor layer 123a. For example, the sacrificial channel layers 125 may include a material having etch selectivity with respect to materials of the mold insulating layers 120, the sacrificial layers 180, and the preliminary semiconductor layer 123a. Thus, the sacrificial channel layers 125 may be selectively etched while minimizing etching of the mold insulating layers 120, the sacrificial layers 180, and the preliminary semiconductor layer 123a with respect to the predetermined etchant. The preliminary semiconductor layer 123a may be formed of, for example, undoped polycrystalline silicon (Si).

Figure 20A:
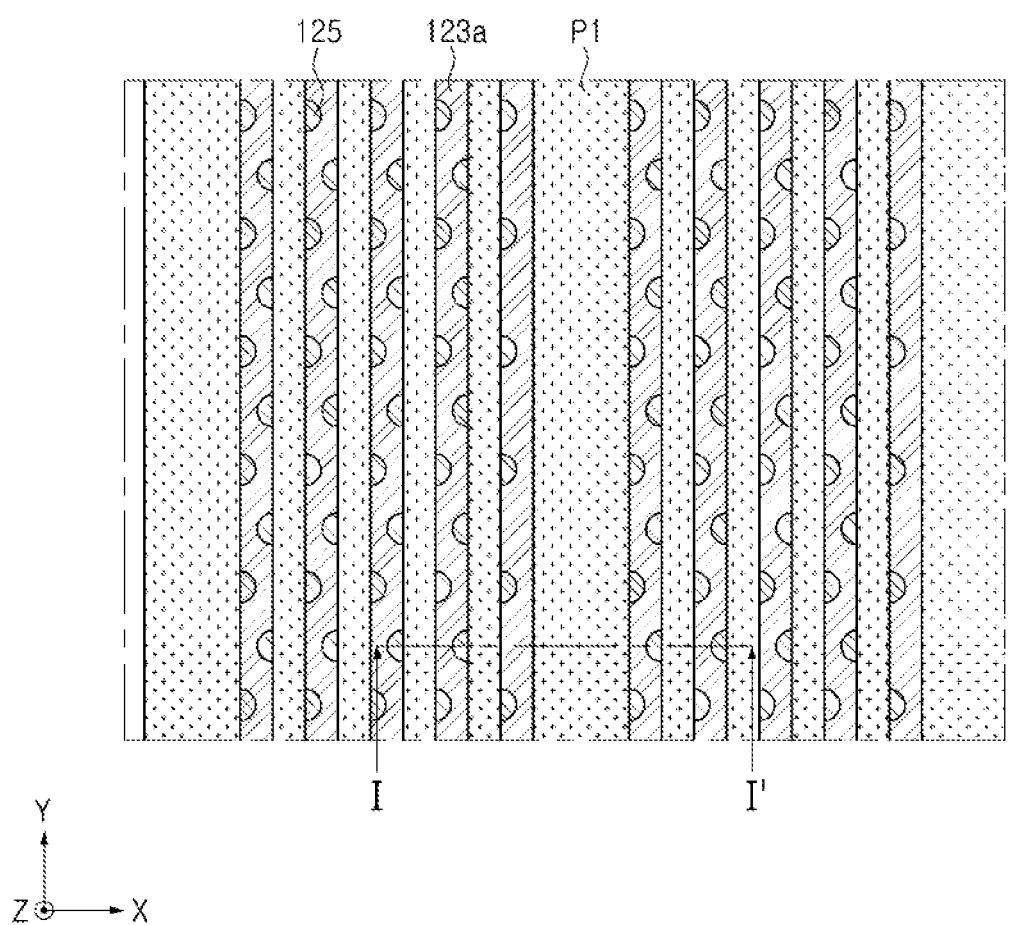
Figure 20B:
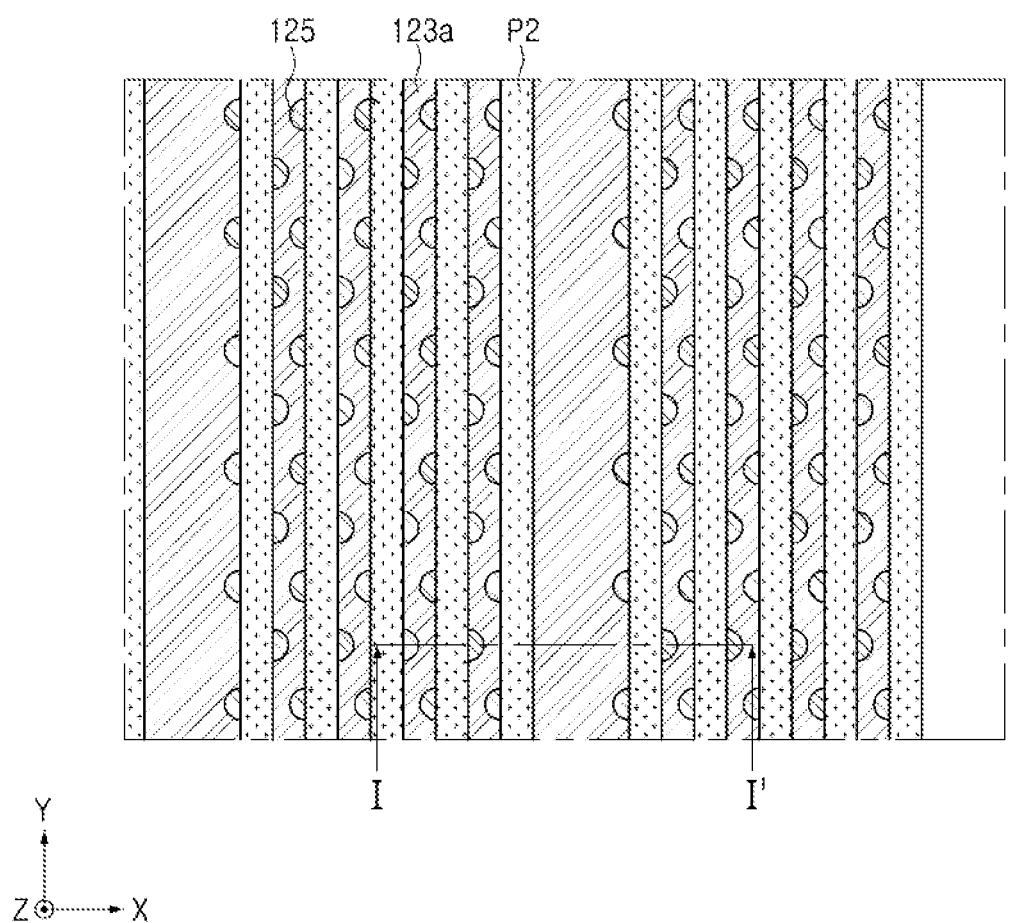
Figure 21:
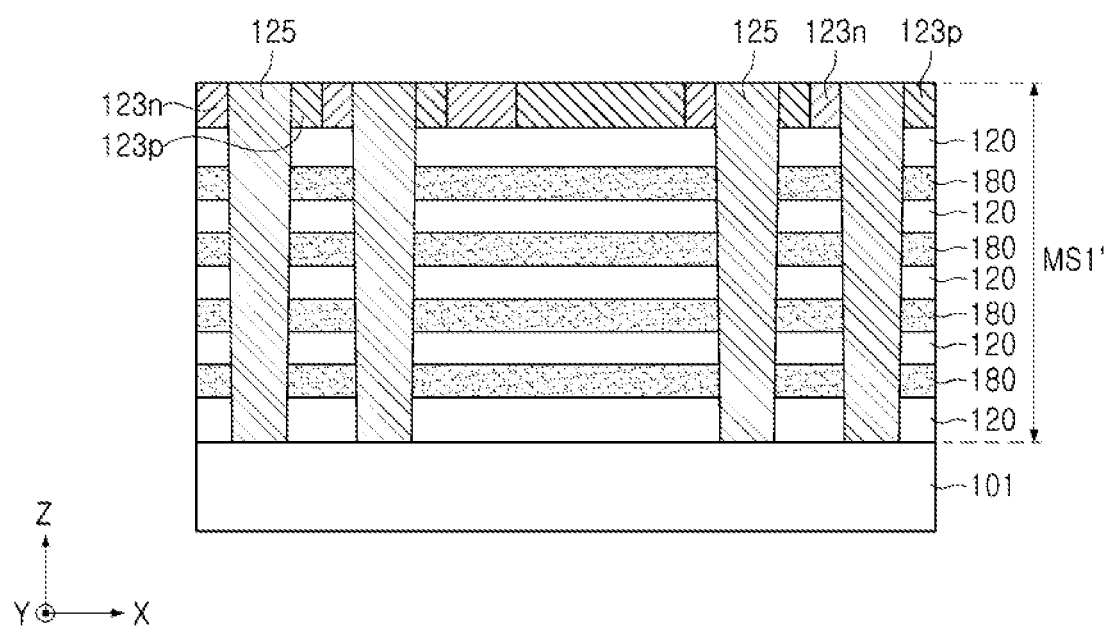

Referring to FIGS. 20A, 20B, and 21, first semiconductor regions 123n and second semiconductor regions 123p alternately disposed in the X direction and extending in the Y direction may be formed. The first semiconductor regions 123n may partially surround a portion of an upper region of the sacrificial channel layers 125, and the second semiconductor regions 123p may surround the other region of the upper region of the sacrificial channel layers 125. In a single sacrificial channel layer 125, one of the first semiconductor regions 123n may be disposed on one side of the upper region of the sacrificial channel layer 125, and one of the second semiconductor regions 123p may be disposed on the other side of the upper region of the sacrificial channel layer 125. Referring to FIG. 20A, a first protective layer P1 exposing partial regions of the preliminary semiconductor layer 123a may be formed, and n-type impurities may be implanted into the exposed partial regions of the preliminary semiconductor layer 123a through an ion implantation process. The first protective layer Pt may include first openings extending in the Y direction and exposing partial regions of the preliminary semiconductor layer 123a. The first protective layer P1 may be removed after the ion implantation process for implanting n-type impurities is completed. Thus, the first semiconductor regions 123n including n-type impurities may be formed in the first stack structure MS1'. Referring to FIG. 20B, a second protective layer P2 exposing the other regions of the preliminary semiconductor layer 123a may be formed, and p-type impurities may be implanted into the other regions of the preliminary semiconductor layer 123a through an ion implantation process. The second protective layer P2 may include second openings extending in the Y direction and exposing the other regions of the preliminary semiconductor layer 123a, The second protective layer P2 may be removed after the ion implantation process for implanting p-type impurities is completed. Thus, the second semiconductor regions 123p including p-type impurities may be formed in the first stack structure MS1'.

Figure 22:
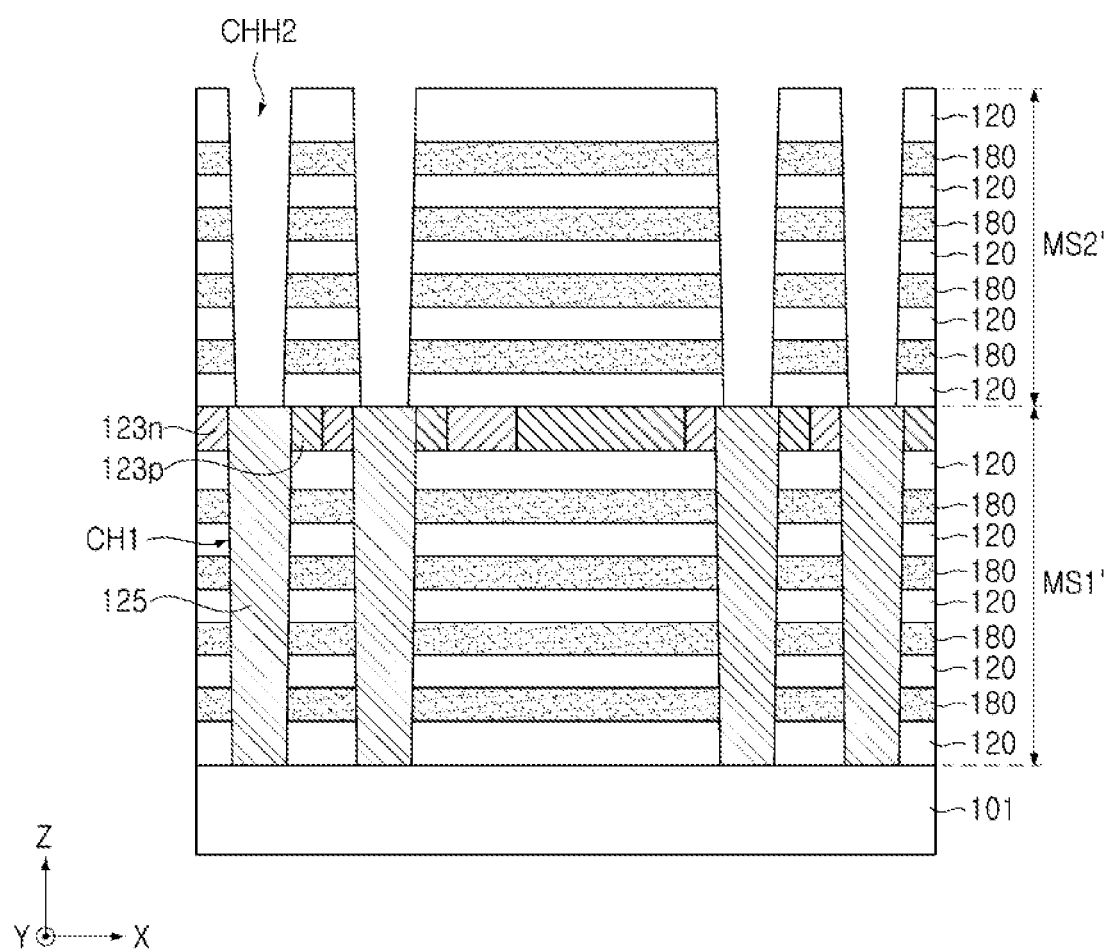

Referring to FIG. 22, a second stack structure MS2' may be formed on the first stack structure MS1'. The second stack structure MS2' may be formed by alternately stacking mold insulating layers 120 and sacrificial layers 180 on the first stack structure MS1'.

Second channel holes CHH2 penetrating through the second stack structure MS2' and exposing the sacrificial channel layers 125 may be formed. Side walls of the second channel holes CHH2 may not be perpendicular to an upper surface of the substrate 101. For example, the second channel holes CHH2 may have sloped side walls.

Figure 23:
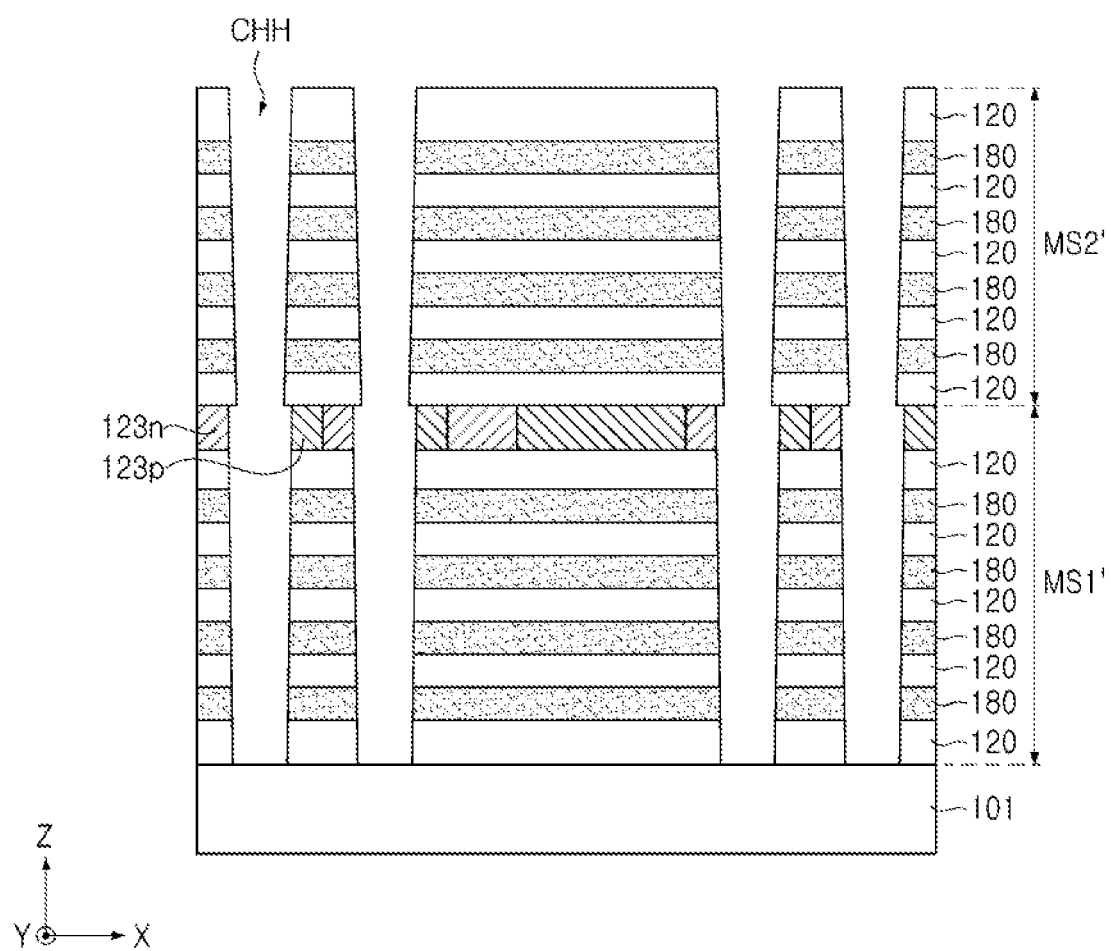

Referring to FIG. 23, by removing the sacrificial channel layers 125 exposed through the second channel holes CHH2, channel holes CHH penetrating the second stack structure MS2' and the first stack structure MS1' may be formed. The channel holes CHH may have a stepped portion on a boundary between the second stack structure MS2' and the first stack structure MS1'. Widths of the channel holes CHH may change discontinuously on the boundary between the second stack structure MS2' and the first stack structure MS1'.

Referring back to FIG. 18, channel structures CH' each may be formed by forming a gate dielectric layer 145a, a channel layer 140a, a gap-fill insulating layer 150, and a channel pad 155 through the processes described with reference to FIG. 11. The channel structures CH' may include first channel structures CH1' and second channel structures CH2' stacked upwardly and downwardly. The channel structure CH' may have one channel pad 155 disposed in an upper portion of the second channel structure CH2'. The gate dielectric layer 145a, the channel layer 140a, and the gap-fill insulating layer 150 may be continuously formed in the first channel structures CH1' and the second channel structures CH2 stacked upwardly and downwardly. An opening OP (see FIG. 13) may be formed through the process descried with reference to FIGS. 12 and 13, and sacrificial layers 180 exposed through the opening OP may be substituted with gate electrodes 130. A separation region SA may be formed by forming a source insulating layer 172 and a source conductive layer 170 in the opening OP (see FIGS. 13 and 14). On a boundary between the second gate structure GS2' and the first gate structure GS1', the gate dielectric layer 145a and the channel layer 140a may have bent portions bent in a horizontal direction and then bent towards the substrate 101. On the boundary between the second gate structure GS2' and the first gate structure GS1', a width of the gap-fill insulating layer 150 may change discontinuously. On the boundary between the second gate structure GS2' and the first gate structure GS1', a width of the channel structure CH' may change discontinuously.

Figure 24:
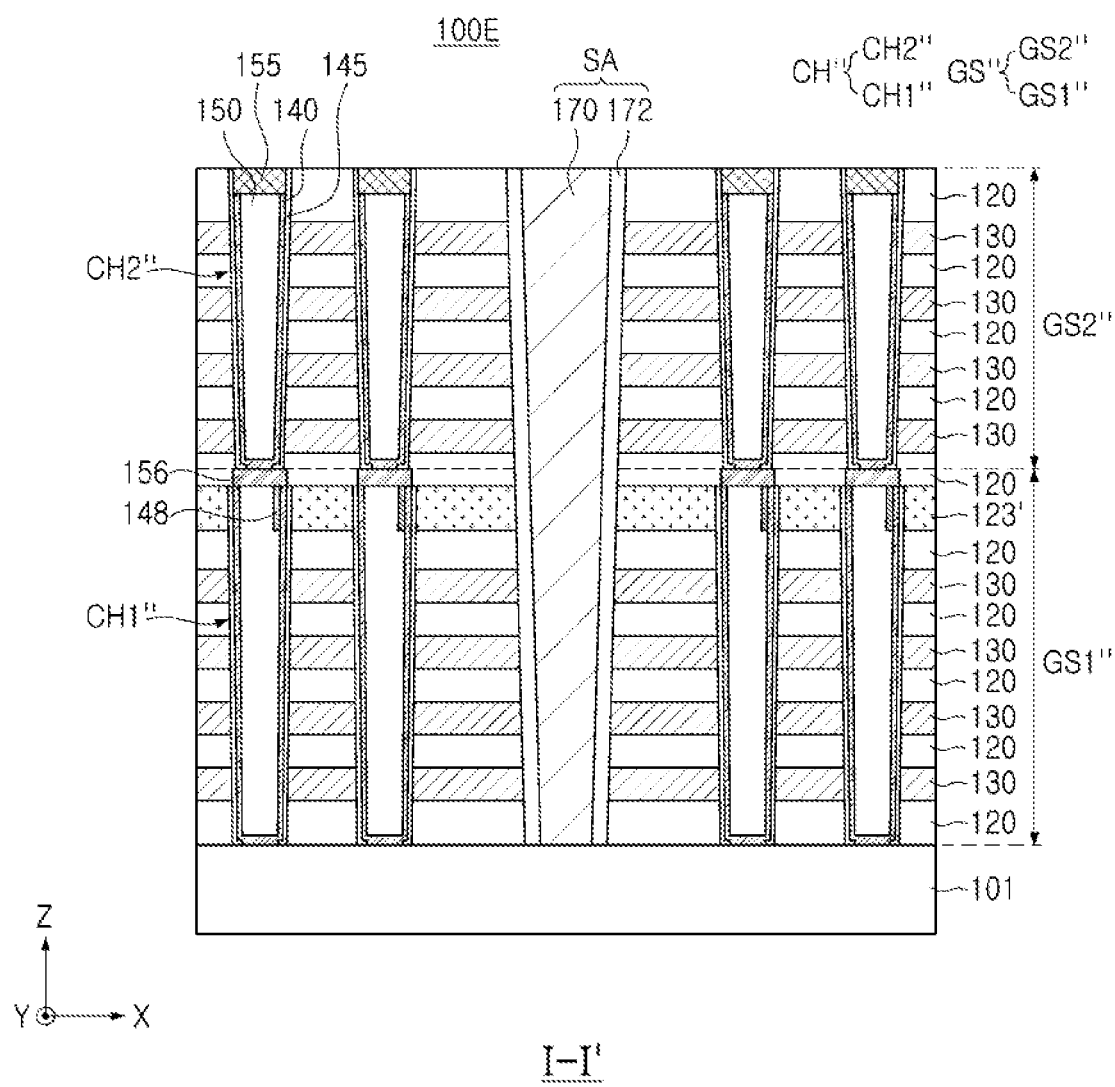
FIG. 24 is a cross-sectional diagram illustrating a vertical-type memory, device according to an example embodiment of the present inventive concept.

FIG. 24 is a cross-sectional diagram illustrating a vertical-type memory device according to an example embodiment of the present inventive concept.

Referring to FIG. 24, a vertical-type memory device 100E may include a substrate 101, gate structures GS" disposed on the substrate 101 and including gate electrodes 130, channel structures CH" extending in a direction (e.g., Z direction) perpendicular to an upper surface of the substrate 101 and penetrating the gate structures GS", and separation regions SA alternately disposed with the gate structures GS" in a direction (e.g., X direction) parallel to an upper surface of the substrate 101 on the substrate 101.

The gate structures GS" may include a first gate structure GS1" and a second gate structure GS2" sequentially stacked on the substrate 101. The first and second gate structure GS1" and GS2" each may include alternately stacked mold insulating layers 120 and gate electrodes 130 along the Z direction. The first gate structure GS1" may further include a semiconductor layer 123' disposed above the gate electrodes 130. The separation regions SA each may include a source conductive layer 170 and a source insulating layer 172.

The first channel structure CH1" and the second channel structure CH2" included in the channel structures CH" may be connected to each other in the Z direction perpendicular to an upper surface of the substrate 101.

The first channel structure CH1" may include a gate dielectric layer 145, a channel layer 140, a gap-fill insulating layer 150, an insulating layer 148, and a channel pad 156, and the second channel structure CH2" may include a dielectric layer 145, a channel layer 140, a gap-fill insulating layer 150, and a channel pad 155.

The insulating layer 148 may be locally disposed on an internal side surface of the channel layer 140 adjacent to the semiconductor layer 123'. The channel pad 156 may cover the insulating layer 148 and the first channel layer 140. For example, the first gate structure GS1" may include the channel layer 140 penetrating the first gate structure GS1", and the insulating layer 148 may be positioned at a level the same as a level of the semiconductor layer 123' and locally disposed on an internal side surface of the channel layer 140. The insulating layer 148 may include or formed of aluminum oxide ($Al_2O_3$). However, the present inventive concept is not limited thereto. For example, in an example embodiment of the present inventive concept, the insulating layer 148 may include, for example, hafnium oxide ($HfO_2$), zirconium-oxide ($ZrO_2$), tantalum-oxide ($Ta_2O_5$), or titanium-oxide ($TiO_2$). An interfacial oxide layer may be formed between the insulating layer 148 and the channel layer 140. Negative fixed charges may be formed in the insulating layer 148 and the interfacial oxide layer. The interfacial oxide layer may be, for example, a silicon oxide ($SiO_2$) layer. The insulating layer 148 including aluminum oxide ($Al_2O_3$) may be capable of retaining negative fixed electric charge and is negatively charged. The insulating layer 148, which is negatively charged, may be disposed adjacent to the channel layer 140 to induce holes in the channel layer 140 of the first channel structure CH1". Accordingly, holes may be more easily transferred in a portion of the Channel layer 140 adjacent to the insulating layer 148 than in the other portion of the channel layer 140 which is not adjacent to the insulating layer 148. Electrons may be more easily transferred in the other portion of the channel layer 140 which is not adjacent to the insulating layer 148 than in the portion of the channel layer 140 which is adjacent to the insulating layer 148. Thus, electron and hole paths may coexist between the channel layer 140 of the first channel structure CH1" and the channel layer 140 of the second channel structure CH2". As the holes are easily transferred, an operation of erasing data in memory cells of the vertical-type memory device 100E may easily be performed.

The channel layer 140 of the second channel structure CH2" may be electrically connected to the channel layer 140 of the first channel structure all CH" by the channel pad 156. The channel pad 156 may be formed of undoped polycrystalline silicon (Si).

According to the aforementioned example embodiments of the present inventive concept, a vertical-type memory device having enhanced integration density and excellent electrical properties may be provided.

While the example embodiments have been shown and described above, it will be apparent to those skilled in the art that modifications and variations could be made without departing from the spirit and scope of the present inventive concept as defined by the appended claims.

What is claimed is:

1. A vertical-type memory device comprising:
    a first gate structure including first gate electrodes spaced apart from each other and stacked on a substrate;
    first channel structures each formed in a first channel hole, penetrating through the first gate structure and being in contact with the substrate;
    a second gate structure including second gate electrodes spaced apart from each other and stacked on the first gate structure; and
    second channel structures each formed in a second channel hole, penetrating through the second gate structure and being in contact with the first channel structures,
    wherein the first channel structures each includes a first channel layer penetrating the first gate structure, and a first channel pad formed in the first channel hole, disposed on the first channel layer and including a first pad region including n-type impurities and a second pad region including p-type impurities.

2. The vertical-type memory device of claim 1, wherein the second channel structures each includes a second channel layer penetrating the second gate structure, and a second channel pad disposed on the second channel layer and including n-type impurities.

3. The vertical-type memory device of claim 2, wherein the second channel layer is in contact with the first pad region and the second pad region.

4. The vertical-type memory device of claim 1, wherein a size of the first pad region and a size of the second pad region are different from each other.

5. The vertical-type memory device of claim 1, further comprising:
    a diffusion barrier layer disposed between the first pad region and the second pad region.

6. The vertical-type memory device of claim 5, wherein the diffusion barrier layer includes silicon nitride.

7. The vertical-type memory device of claim 1, wherein the first pad regions and the second pad regions of the first channel structures disposed in a first direction parallel to an upper surface of the substrate are alternately disposed in the first direction.

8. The vertical-type memory device of claim 7, wherein the first pad regions and the second pad regions of the first channel structures disposed in a second direction parallel to the upper surface of the substrate and intersecting the first direction are disposed in different straight lines in the second direction.

9. The vertical-type memory device of claim 1, further comprising:
    a third gate structure including third gate electrodes spaced apart from each other and stacked on the second gate structure; and
    third channel structures penetrating through the third gate structure and being in contact with the second channel structures.

10. The vertical-type memory device of claim 9, wherein the second channel structures each includes a second channel layer penetrating the second gate structure, and a second channel pad disposed on the second channel layer and including a first pad region including n-type impurities and a second pad region including p-type impurities.

11. The vertical-type memory device of claim 10, wherein the third channel structures each includes a third channel layer penetrating the third gate structure, and a third channel pad disposed on the third channel layer and including n-type impurities.

12. The vertical-type memory device of claim 1, further comprising:
a base substrate disposed below the substrate; and
transistors disposed on the base substrate and included in a peripheral circuit.

13. A vertical-type memory device comprising:
a first gate structure including first gate electrodes spaced apart from each other and stacked on a substrate, and a semiconductor layer disposed on the first gate electrodes;
a second gate structure including second gate electrodes spaced apart from each other and stacked on the first gate structure; and
channel structures penetrating through the first gate structure and the second gate structure and being in contact with the substrate,
wherein the semiconductor layer includes first semiconductor regions and second semiconductor regions extending in a first direction parallel to an upper surface of the substrate and alternately disposed in a second direction intersecting the first direction,
wherein the first semiconductor regions are doped with impurities having a conductivity type different from that of impurities doped in the second semiconductor regions, and
wherein each of the channel structures penetrates through the semiconductor layer with one side surface being in contact with one of the first semiconductor regions, and an other side surface being in contact with one of the second semiconductor regions.

14. The vertical-type memory device of claim 13,
wherein the first semiconductor regions include n-type impurities, and the second semiconductor regions include p-type impurities.

15. The vertical-type memory device of claim 14, further comprising:
a separation region penetrating through the first and second gate structures and extending in the first direction,
wherein one of the first semiconductor regions is disposed on one side of the separation region, and one of the second semiconductor regions is disposed on the other side of the separation region.

16. The vertical-type memory device of claim 13,
wherein the channel structures each includes a channel layer penetrating the first gate structure and the second gate structure, and a gate dielectric layer surrounding the channel layer, and
wherein the channel layer and the gate dielectric layer each has a bent portion bent in a horizontal direction on a boundary between the first gate structure and the second gate structure.

17. A vertical-type memory device comprising:
a first gate structure including first gate electrodes spaced apart from each other and stacked on a substrate, and a semiconductor layer disposed on the first gate electrodes;
a first channel structure penetrating through the first gate structure and being in contact with the substrate;
a second gate structure including second gate electrodes spaced apart from each other and stacked on the first gate structure; and
a second channel structure penetrating through the second gate structure and being in contact with the first channel structure,
wherein the first gate structure includes a first channel layer penetrating the first gate structure, and an insulating layer positioned at a level the same as a level of the semiconductor layer, and locally disposed on an internal side surface of the first channel layer,
wherein the insulating layer is spaced apart from the second channel structure, and
wherein the first channel structure includes a channel pad covering the insulating layer and the first channel layer.

18. The vertical-type memory device of claim 17, wherein the insulating layer is formed of aluminum oxide.

19. The vertical-type memory device of claim 17,
wherein the second channel structure includes a second channel layer penetrating the second gate structure, and
wherein the second channel layer is connected to the first channel layer by the channel pad.

* * * * *